US012588197B2

(12) United States Patent
Lin et al.

(10) Patent No.: US 12,588,197 B2
(45) Date of Patent: Mar. 24, 2026

(54) SEMICONDUCTOR MEMORY DEVICES WITH ONE-SIDED STAIRCASE PROFILES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/361,249

(22) Filed: Jul. 28, 2023

(65) Prior Publication Data

US 2023/0389306 A1     Nov. 30, 2023

Related U.S. Application Data

(63) Continuation of application No. 17/313,174, filed on May 6, 2021, now Pat. No. 11,758,717.

(51) Int. Cl.
*H10B 41/27* (2023.01)
*H10B 41/10* (2023.01)
(Continued)

(52) U.S. Cl.
CPC ............. *H10B 41/27* (2023.02); *H10B 41/10* (2023.02); *H10B 43/10* (2023.02); *H10B 43/27* (2023.02)

(58) Field of Classification Search
CPC ........ H10B 41/27; H10B 41/10; H10B 43/10; H10B 43/27; H10B 41/20; H10B 43/20; H10B 51/10; H10B 51/20; H10B 51/30
See application file for complete search history.

(56) References Cited

U.S. PATENT DOCUMENTS 5,623,439 A * 4/1997 Gotoh ............... H01L 29/78391
                                                          257/295
9,899,394 B2 * 2/2018 Hwang .................. H10B 43/00
(Continued)

FOREIGN PATENT DOCUMENTS

TW          202023030 A      6/2020

OTHER PUBLICATIONS

Office Action issued in connection with Taiwan Appl. No. 110123896 dated Oct. 23, 2024.

*Primary Examiner* — Duy T Nguyen
*Assistant Examiner* — Pratiksha Jayant Lohakare
(74) *Attorney, Agent, or Firm* — Foley & Lardner LLP

(57) ABSTRACT

A semiconductor die comprises: a first semiconductor device and a second semiconductor device. The first semiconductor device comprises a first device portion comprising a first sub-array of memory devices, and a first interface portion located adjacent to the first device portion in a first direction. The first interface portion has a staircase profile in a vertical direction. The second semiconductor device comprises a second device portion adjacent to the first device portion in the first direction opposite the first interface portion. The second device portion comprises a second sub-array of memory devices, and a second interface portion located adjacent to the first device portion in the first direction opposite the first interface portion. The second interface portion also has a staircase profile in the vertical direction. The first semiconductor device is electrically isolated from the second semiconductor device.

20 Claims, 17 Drawing Sheets

(51) Int. Cl.
   *H10B 43/10*      (2023.01)
   *H10B 43/27*      (2023.01)

(56) References Cited

U.S. PATENT DOCUMENTS

| | | | | |
|---|---|---|---|---|
| 10,615,172 | B2 * | 4/2020 | Nagata | H10B 43/27 |
| 11,410,983 | B2 * | 8/2022 | Chen | H01L 24/91 |
| 11,696,449 | B2 * | 7/2023 | Lin | H10B 51/30 |
| | | | | 257/295 |
| 2009/0090960 | A1 | 4/2009 | Izumi et al. | |
| 2012/0280299 | A1 * | 11/2012 | Yun | H10B 43/40 |
| | | | | 257/314 |
| 2014/0048868 | A1 | 2/2014 | Kim et al. | |
| 2014/0162420 | A1 | 6/2014 | Oh et al. | |
| 2015/0236038 | A1 | 8/2015 | Pachamuthu et al. | |
| 2016/0268287 | A1 * | 9/2016 | Park | H10B 43/10 |
| 2016/0276268 | A1 * | 9/2016 | Yada | H01L 21/76877 |
| 2017/0062449 | A1 * | 3/2017 | Villavelez | H01L 29/42324 |
| 2017/0162594 | A1 | 6/2017 | Ahn | |
| 2018/0299253 | A1 | 10/2018 | Liu et al. | |
| 2018/0342531 | A1 * | 11/2018 | Susuki | H10B 43/35 |
| 2019/0221558 | A1 | 7/2019 | Chen et al. | |
| 2019/0326319 | A1 * | 10/2019 | Yun | H10B 43/50 |
| 2020/0227318 | A1 | 7/2020 | Kawasaki et al. | |
| 2020/0365604 | A1 * | 11/2020 | Lai | H10B 43/40 |
| 2020/0402992 | A1 * | 12/2020 | Otsu | H10B 43/27 |
| 2021/0118867 | A1 * | 4/2021 | Chen | H01L 24/13 |
| 2021/0125928 | A1 * | 4/2021 | Kim | H01L 23/535 |
| 2021/0143179 | A1 * | 5/2021 | Song | H10B 43/35 |
| 2021/0296255 | A1 | 9/2021 | Konomi | |
| 2021/0335804 | A1 * | 10/2021 | Yeh | H10B 43/10 |
| 2021/0384124 | A1 * | 12/2021 | Wang | H10B 43/27 |
| 2022/0059157 | A1 * | 2/2022 | Cui | G11C 11/4085 |
| 2022/0123009 | A1 | 4/2022 | Lee et al. | |
| 2022/0149062 | A1 | 5/2022 | Zhang et al. | |
| 2022/0189986 | A1 | 6/2022 | Ninomiya | |
| 2022/0231050 | A1 * | 7/2022 | Young | G11C 11/223 |
| 2022/0320141 | A1 * | 10/2022 | Lin | H10B 51/50 |

* cited by examiner

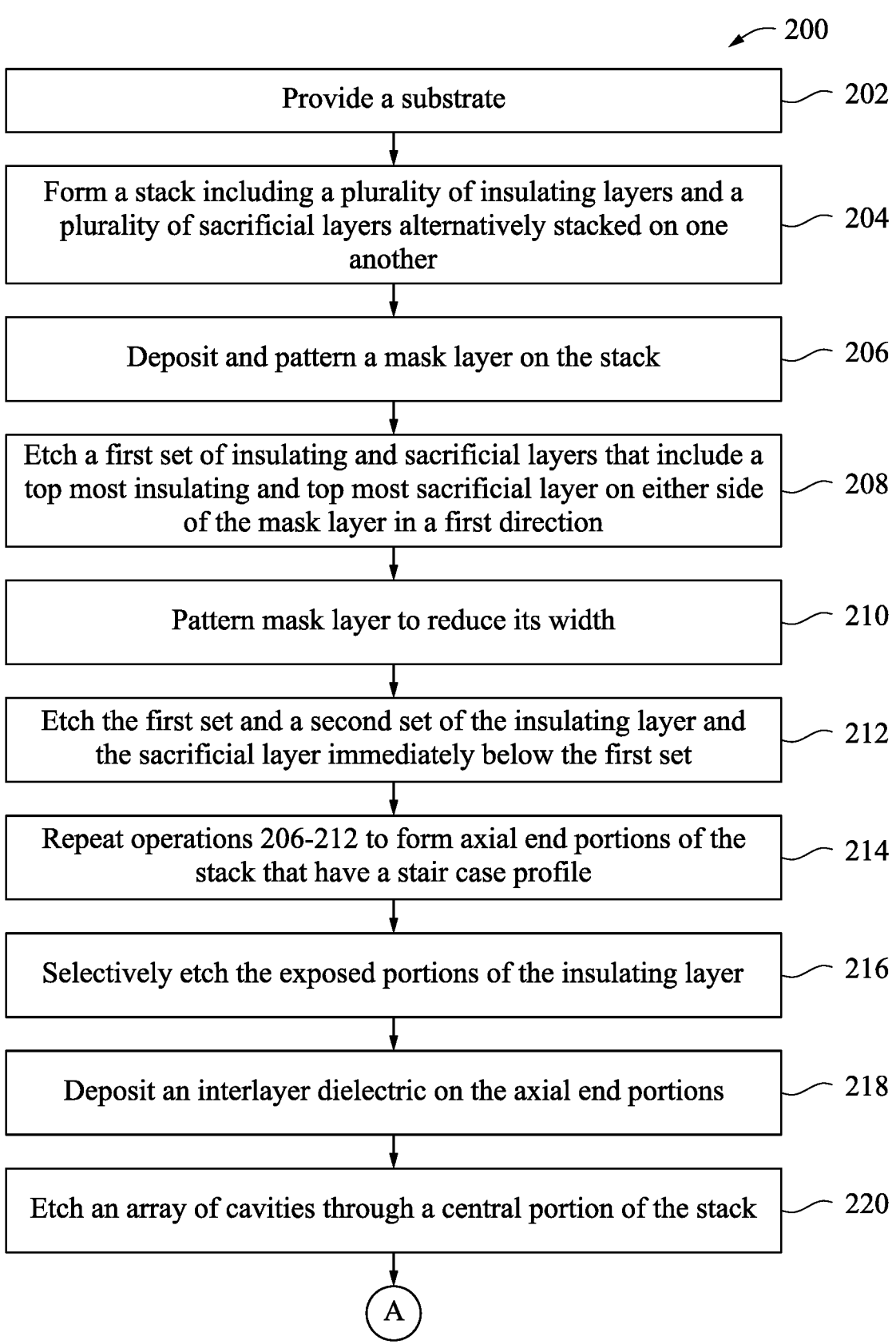

┌────────────────────────────────────────────────────────┐
│ Provide a substrate                                      │ 202
└────────────────────────────────────────────────────────┘

┌────────────────────────────────────────────────────────┐
│ Form a stack including a plurality of insulating layers  │
│ and a plurality of sacrificial layers alternatively      │ 204
│ stacked on one another                                   │
└────────────────────────────────────────────────────────┘

┌────────────────────────────────────────────────────────┐
│ Deposit and pattern a mask layer on the stack            │ 206
└────────────────────────────────────────────────────────┘

┌────────────────────────────────────────────────────────┐
│ Etch a first set of insulating and sacrificial layers    │
│ that include a top most insulating and top most          │ 208
│ sacrificial layer on either side of the mask layer in    │
│ a first direction                                        │
└────────────────────────────────────────────────────────┘

┌────────────────────────────────────────────────────────┐
│ Pattern mask layer to reduce its width                   │ 210
└────────────────────────────────────────────────────────┘

┌────────────────────────────────────────────────────────┐
│ Etch the first set and a second set of the insulating    │
│ layer and the sacrificial layer immediately below the    │ 212
│ first set                                                │
└────────────────────────────────────────────────────────┘

┌────────────────────────────────────────────────────────┐
│ Repeat operations 206-212 to form axial end portions     │
│ of the stack that have a stair case profile              │ 214
└────────────────────────────────────────────────────────┘

┌────────────────────────────────────────────────────────┐
│ Selectively etch the exposed portions of the insulating  │ 216
│ layer                                                    │
└────────────────────────────────────────────────────────┘

┌────────────────────────────────────────────────────────┐
│ Deposit an interlayer dielectric on the axial end        │ 218
│ portions                                                 │
└────────────────────────────────────────────────────────┘

┌────────────────────────────────────────────────────────┐
│ Etch an array of cavities through a central portion of   │ 220
│ the stack                                                │
└────────────────────────────────────────────────────────┘

SEMICONDUCTOR MEMORY DEVICES WITH ONE-SIDED STAIRCASE PROFILES AND METHODS OF MANUFACTURING THEREOF

CROSS-REFERENCE TO RELATED APPLICATION

This application is related to and claims priority under 35 U.S. § 120 as a continuation of U.S. Utility application Ser. No. 17/313,174, filed on May 6, 2021 (now U.S. Pat. No. 11,758,717), and titled "SEMICONDUCTOR MEMORY DEVICES AND METHODS OF MANUFACTURING THEREOF," the entire contents of which are incorporated herein by reference for all purposes.

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate a schematic flowchart of a method for manufacturing a semiconductor die including a first semiconductor device and a second semiconductor device, according to some embodiments.

DETAILED DESCRIPTION

Figures 1, 2:
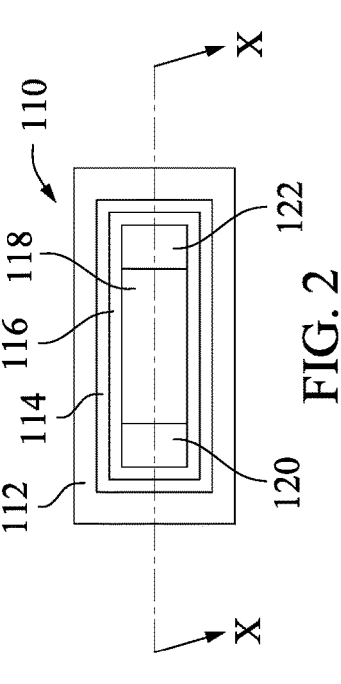
FIG. 1 is a top view of a semiconductor die include a first semiconductor device and a second semiconductor device, according to an embodiment.
FIG. 2 is a top view of one memory device of a plurality of memory devices included in the first semiconductor device and the second semiconductor device of FIG. 1, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate. Such double gate structures can provide a higher etching aspect ratio. During fabrication, the die including an array of memory devices is formed such that an interface portion is formed on either side of the array of memory devices to allow electrical interface with the memory devices included in the array. Such an interface portion may have a staircase profile. However, only one of the staircase profile interface portions is used for electrical interface (e.g., electrical coupling of the gate to a controller or driver), which reduces active chip area as the other staircase interface portion is not employed for electrical interfacing. Therefore, a large area of the wafer in which a plurality of the 3D memory dies includes the extra interface portion which remains unused.

Embodiments of the present disclosure are discussed in the context of forming a semiconductor die, and particularly in the context of forming 3D memory devices such as gate all around (GAA) memory devices, that are formed in a stack of insulating and gate layers. For example, the present disclosure provides semiconductor dies which include a first semiconductor device and a second semiconductor device formed adjacent to each other, but electrically isolated from each other. Each semiconductor device includes an interface portion having a staircase profile. Thus, the die does not include an unused interface portion, resulting in wafer area saving, and a higher number of dies per wafer.

FIG. 1 illustrates a perspective view of a semiconductor die 100 including a first semiconductor device 102a and a second semiconductor device 102b, according to an embodiment. The first semiconductor device 102a includes a first device portion 104a including a first sub-array of memory devices 110, and a first interface portion 106a located adjacent to the first device portion 104a in a first direction, for example, an X-direction. The first interface portion 106a has a staircase or step profile in a vertical direction or the Z-direction, as described later in further detail herein. The second semiconductor device 102b is located adjacent to the first semiconductor device 102a opposite the first interface portion 106a, such that the first semiconductor device 102a is electrically isolated from the second semiconductor device 102b.

The second semiconductor device 102b includes a second device portion 104b adjacent the first device portion 104a opposite the first interface portion 106a in the first direction (i.e., the X-direction). An isolation wall 138 is interposed between the first device portion 104a and the second device portion 104b, which electrically isolates the first device portion 104a from the second device portion 104b. The second device portion 104b includes a second array of memory devices 110. The second semiconductor device 102b also includes a second interface portion 106b located adjacent to the second device portion 104b in the first direction opposite the first interface portion 106a. In other words, the first interface portion 106a and the second interface portion 106b are located at opposite axial ends of the semiconductor die 100. Similar to the first interface portion 106a, the second interface portion 106b has a staircase profile in the vertical direction (i.e., the Z-direction.) Each of the first semiconductor device 102a and the second semiconductor device 102b may be disposed on a substrate (e.g., a silicon substrate). In addition, a plurality of horizontal isolation walls 136 electrically isolate adjacent rows of memory devices 110 from each other.

Figure 3:
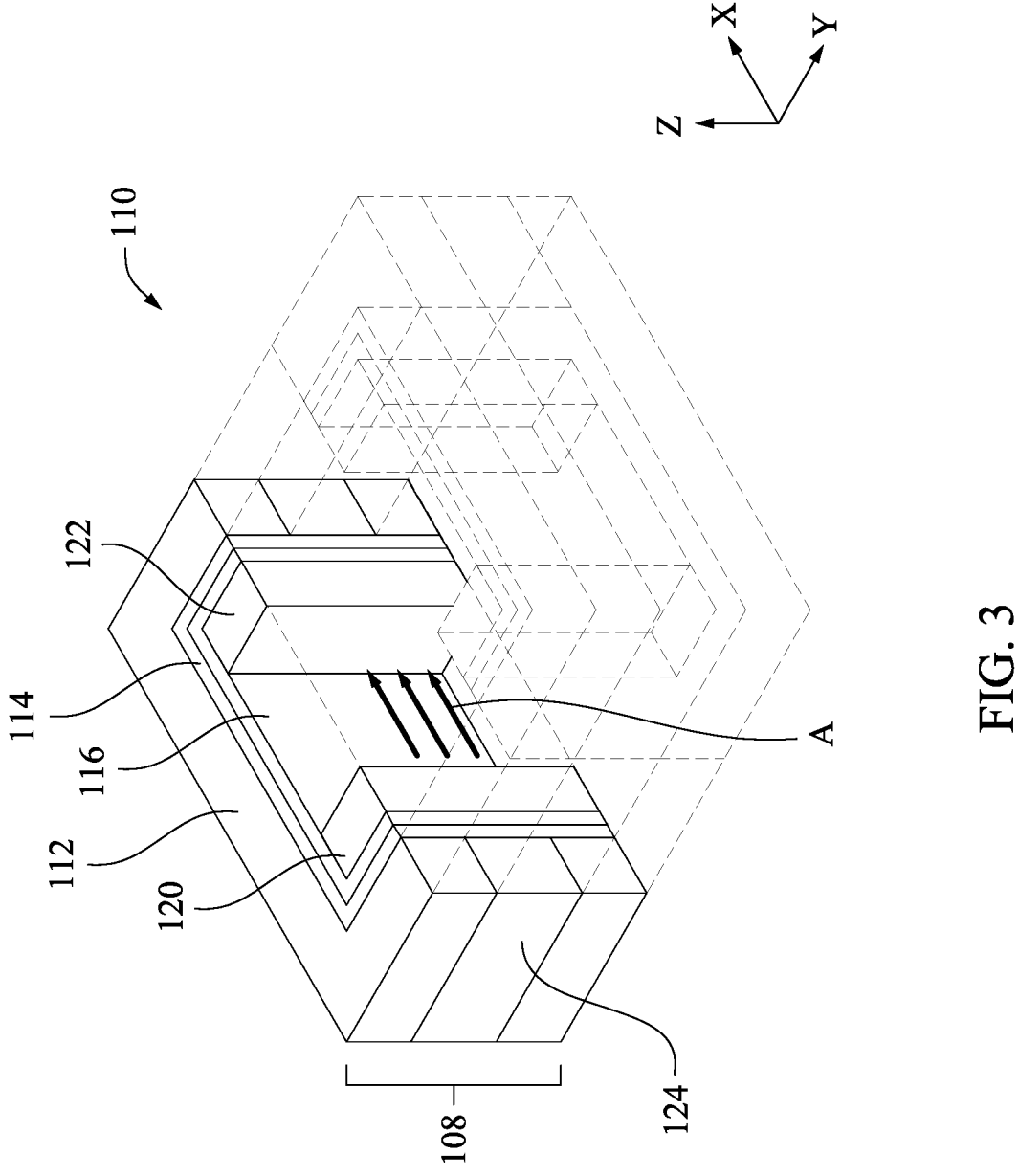
FIG. 3 is perspective cross-sectional view of the memory device of FIG. 2 taken along the line X-X in FIG. 2.

FIG. 2 is a top view of a memory device 110 of included in the semiconductor die 100, according to an embodiment. FIG. 3 is perspective cross-sectional view of the memory device 110 of FIG. 2 taken along the line X-X in FIG. 2. The memory device 110 includes a source 120 and a drain 122 separated from the source 120 in the first direction or the X-direction by an inner spacer 118. The source 120 and drain 122 may include a conducting material (e.g., a n or p-doped semiconductor such as Si, SiGe, etc.), and may be formed using deposition process, an epitaxial growth process, or any other suitable process.

The inner spacer 118 extends between the source 120 and the drain 122. The inner spacer 118 may be formed from an electrically insulating material, for example, silicon nitride (SiN), silicon oxide (SiO), silicon carbide nitride (SiCN), silicon oxycarbonitride (SiOCN), silicon oxynitride (SiON), etc.

A channel layer 116 is disposed on radially outer surfaces of the source 120, the drain 122, and the inner spacer 118 such that the channel wraps around the source 120, the drain 122, and the inner spacer 118 and extends in the Z-direction. In some embodiments, the channel layer 116 may be formed from a semiconductor material, for example, Si (e.g., poly-silicon or amorphous silicon), Ge, SiGe, silicon carbide (SiC), etc.

A memory layer 114 is disposed on a radially outer surface of the channel layer 116 such that the memory layer 114 wraps around the channel layer 116. In some embodiments, the memory layer 114 may include a ferroelectric material, for example, lead zirconate titanate (PZT), PbZr/TiO$_3$, BaTiO$_3$, PbTiO$_2$, etc.

The memory device 110 also includes a stack 108 wrapped around the memory layer 114. As shown in FIG. 3, the stack 108 includes a plurality of insulating layers 112 and a plurality of gate layers 124 alternatively stacked on top each other in the vertical or Z-direction, such that the insulating layers 112 and the gate layers 124 wrap around the memory layer 114. While FIG. 3 shows only one gate layer 124 and a two insulating layers 112, it should be understood that stack 108 may include any number of insulating layers 112 and gate layers 124 alternatively stacked on top of each other in the vertical direction. In some embodiments, a topmost layer and a bottommost layer of the stack 108 may include an insulating layer 112 of the plurality of insulating layers 112. The lower most insulating layer 112 may be disposed on the substrate.

The insulating layer 112 may include silicon nitride (SiN), silicon oxide (SiO), silicon carbide nitride (SiCN), silicon oxycarbonitride (SiOCN), silicon oxynitride (SiON), etc. Moreover, the gate layer 124 may be formed from a conductive material such as a metal, for example, tungsten (W), copper (Cu), cobalt (Co). etc., or a high-k dielectric material, for example, hafnium oxide (HfO), tantalum nitride (TaN), etc.

As shown in FIG. 1, the insulating layers 112 and the gate layers 124 extend from the first or second device portions 104a, 104b, to their corresponding first and second interface portion 106a, 106b, respectively. The insulating layers 112 and the gate layers 124 have a length such that a lower most first pair of an insulating layer 112 and a gate layer 124 has a longer length than a subsequent second pair of an insulating layer 112 and a gate layer 124 disposed immediately above the lower most pair in the Z-direction. Similarly, a subsequent third pair of an insulating layer 112 and a gate layer 124 disposed above the second pair in the Z-direction has a shorter length than the second pair such that each subsequent pair has a shorter length than an immediately preceding pair disposed below it.

In some embodiments the first interface portion 106a and the second interface portion 106b include an interlayer dielectric (ILD) 126 disposed on portions of the insulating layers 112 and the gate layers 124 forming the interface portions 106a/b. In such embodiments, vias may be formed through the ILD 126 at predetermined locations to allow electronic access to the underlying portions of gate layers 124. Each of the gate layers 124 extend in the first direction (e.g., the X-direction) from the respective interface portions 106a/b up to the isolation wall 138 such that the gate layers 124 included in the first semiconductor device 102a is electrically isolated from the gate layers 124 included in the second semiconductor device 102b by the isolation wall 138. The dielectric material of the ILD 126 may include SiO, phosphosilicate glass (PSG), borosilicate glass (BSG), boron-doped phosphosilicate Glass (BPSG), undoped silicate glass (USG), or combinations thereof.

The topmost layer in the stack 108 may be an insulating layer 112 that has a shorter length than the gate layer 124 disposed immediately below it, and the interface portions 106a/b are formed by the portion of the subsequent layers disposed below the top insulating layer 112. The step wise increase in length of the subsequent pairs of the insulating layer 112 and the gate layer 124 from the topmost insulating layer 112 to the bottommost insulating layer 112 causes the interface portions 106a/b to have a staircase or step profile in the vertical or Z-direction with a portion of the gate layer 124 in each pair forming a top exposed layer of each step in the interface portions 106a/b. The interface portions 106a/b provide an electrical connection interface allowing a controller or driver to be electrically coupled to the gate layer 124. Activating the gate layer 124 by applying a voltage to it, causes current to flow from the source 120 to the drain 122, as indicated by the arrow A.

Figures 4A, 4B, 4C, 4D:
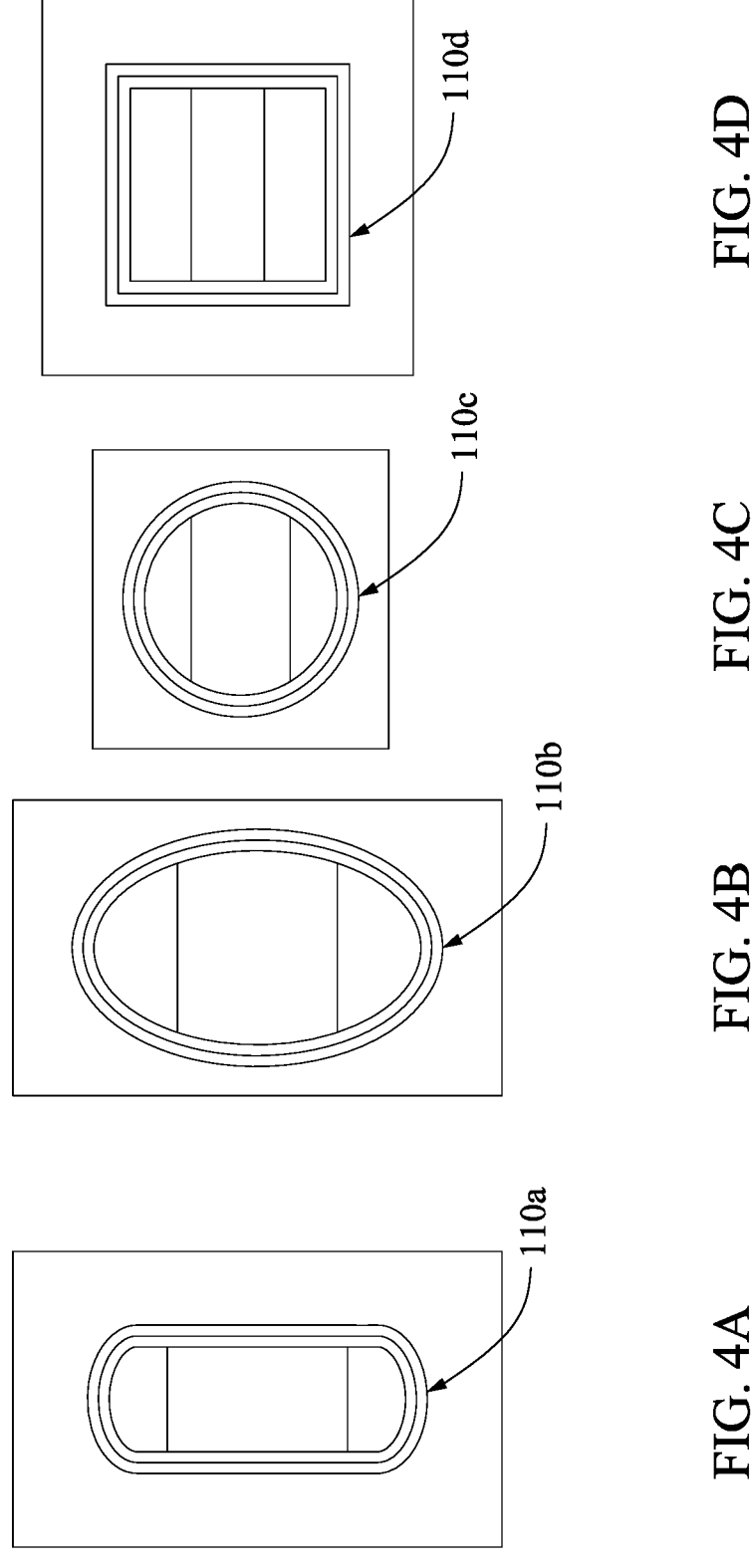
FIGS. 4A-4D are top views of various memory devices having different shapes, according to some embodiments.

FIGS. 1-2 show each memory device 110 having a rectangular shape in the X-Y plane. In other embodiments, the memory device 110 may have any suitable shape. For example, FIG. 4A shows a memory device 110a that has a rectangular shape in the X-Y plane such that the axial ends of the memory device 110a are rounded. Similarly, FIG. 4B shows a memory device 110b having an oval or elliptical shape in the X-Y plane, FIG. 4C shows a memory device 110*c* having a circular shape in the X-Y plane, and FIG. 4D shows a memory device 110*d* having a square shape in the X-Y plane.

Figure 5B:
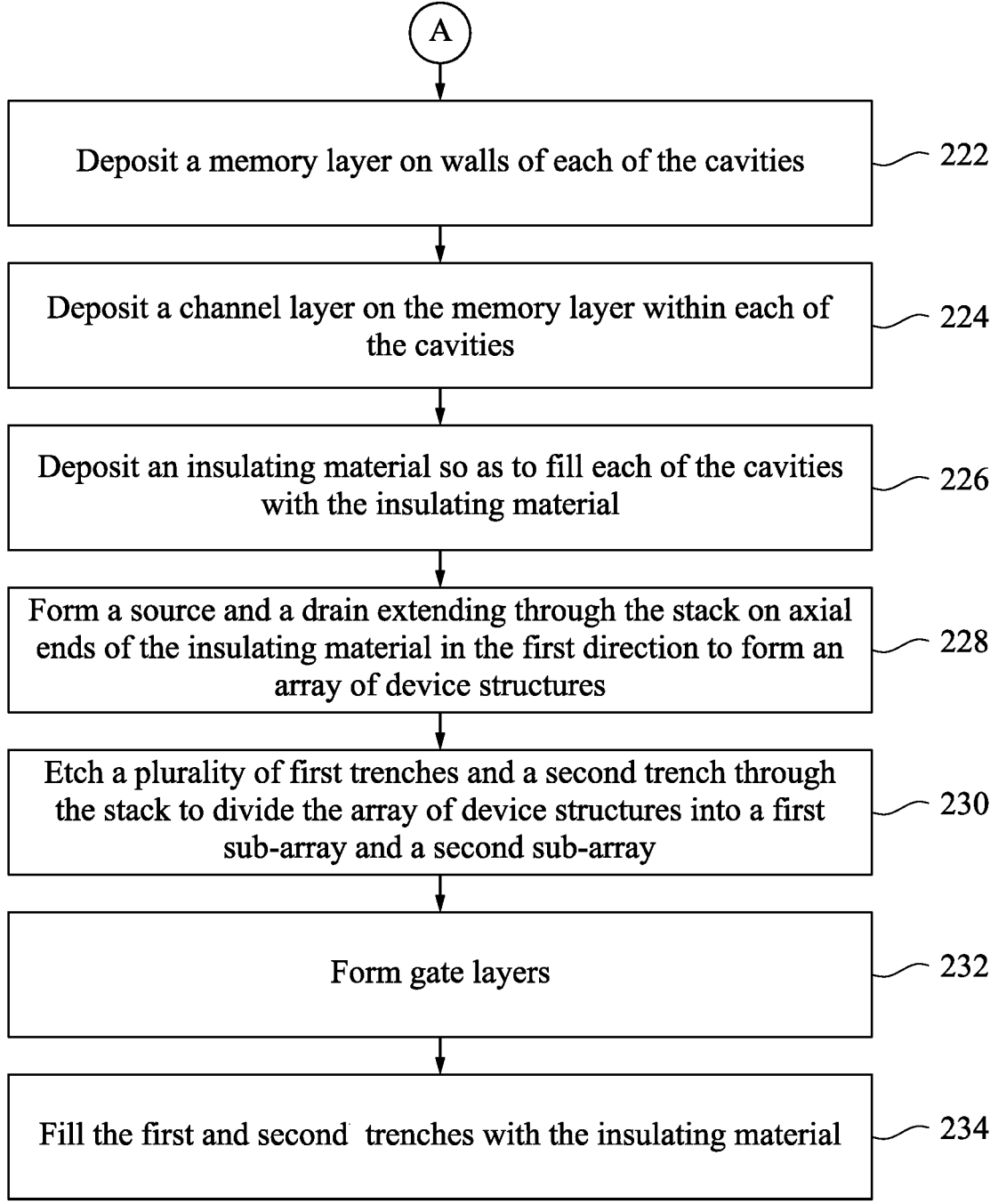

FIGS. 5A-5B illustrate a flowchart of a method 200 to form a semiconductor die 300, for example, a 3D GAA memory device, according to an embodiment. For example, at least some of the operations (or steps) of the method 200 can be used to form a GAA memory device (e.g., the semiconductor die 100), a nanosheet transistor device, a nanowire transistor device, a vertical transistor device, a gate-all-around (GAA) transistor device, or the like. It should be noted that the method 200 is merely an example, and is not intended to limit the present disclosure. Accordingly, it is understood that additional operations may be provided before, during, and after the method 200 of FIGS. 5A-5B, and that some other operations may only be briefly described herein. In some embodiments, operations of the method 200 may be associated with cross-sectional views of an example semiconductor die 300 at various fabrication stages as shown in FIGS. 6, 7, 8, 9, 10, 11, 12, 13, 14, 15A, 15B, 16A, 16B, 17A, 17B, 18A, 18B, 19A, 19B, and 20, respectively, which will be discussed in further detail below. While various operations of the method 200 and associated illustrations shown in FIGS. 6, 7, 8, 9, 10, 11, 12, 13, 14, 15A, 15B, 16A, 16B, 17A, 17B, 18A, 18B, 19A, 19B, and 20 are described with respect to the semiconductor die 300 that represents a GAA memory device, the operations are equally applicable to any other semiconductor device (e.g., a GAA FET device, a nanosheet transistor device, a nanowire transistor device, a vertical transistor device, etc.). Although FIGS. 6-20 illustrate the semiconductor die 300 including the plurality of memory devices 110, it is understood the semiconductor die 300 may include a number of other devices such as inductors, fuses, capacitors, coils, etc., which are not shown in FIGS. 6-20, for purposes of clarity of illustration.

The method 200 may general include providing a stack comprising a plurality of insulating layers and a plurality of sacrificial layers alternatively stacked on top each other. One of the insulating layers may form a bottom layer, and another of the insulating layers may form a top layer of the stack. The method 200 also includes forming a first interface portion on a first end and a second interface portion on a second end of the semiconductor die opposite the first end in a first direction (e.g., the X-direction), each of the first interface portion and the second interface portion having a staircase profile in a vertical direction (e.g., the Z-direction). The method 200 may also include forming an array of device structures between the first interface portion and the second interface portion. For example, an array of cavities may be etched through the stack between the interface portions, and a device structure may be formed in each of the cavities so as to form an array of memory devices. The method 200 may also include dividing the array of device structures into a first sub-array and a second sub-array of device structures. For example, a plurality of first trenches may be formed through the stack in the first direction (e.g., the X-direction between each row of device structures included in the array,) and a second trench may be formed through the stack in a second direction perpendicular to the first direction (e.g., the Y-direction). The second trench divides the array into a first sub-array of devices structures included in a first device portion and a second sub-array of device structures included in a second device portion, the second device portion being electrically isolated from the first device portion. The method may also include forming gate layers by replacing the sacrificial layers so as to form a first sub-array of memory devices in the first device portion and a second sub-array of memory devices in the second device portion. Finally, the plurality of first trenches and the second trench are filled with an insulating material so as to form the semiconductor die including a first semiconductor device and the second semiconductor device that are electrically isolated from each other.

Figures 6, 7:
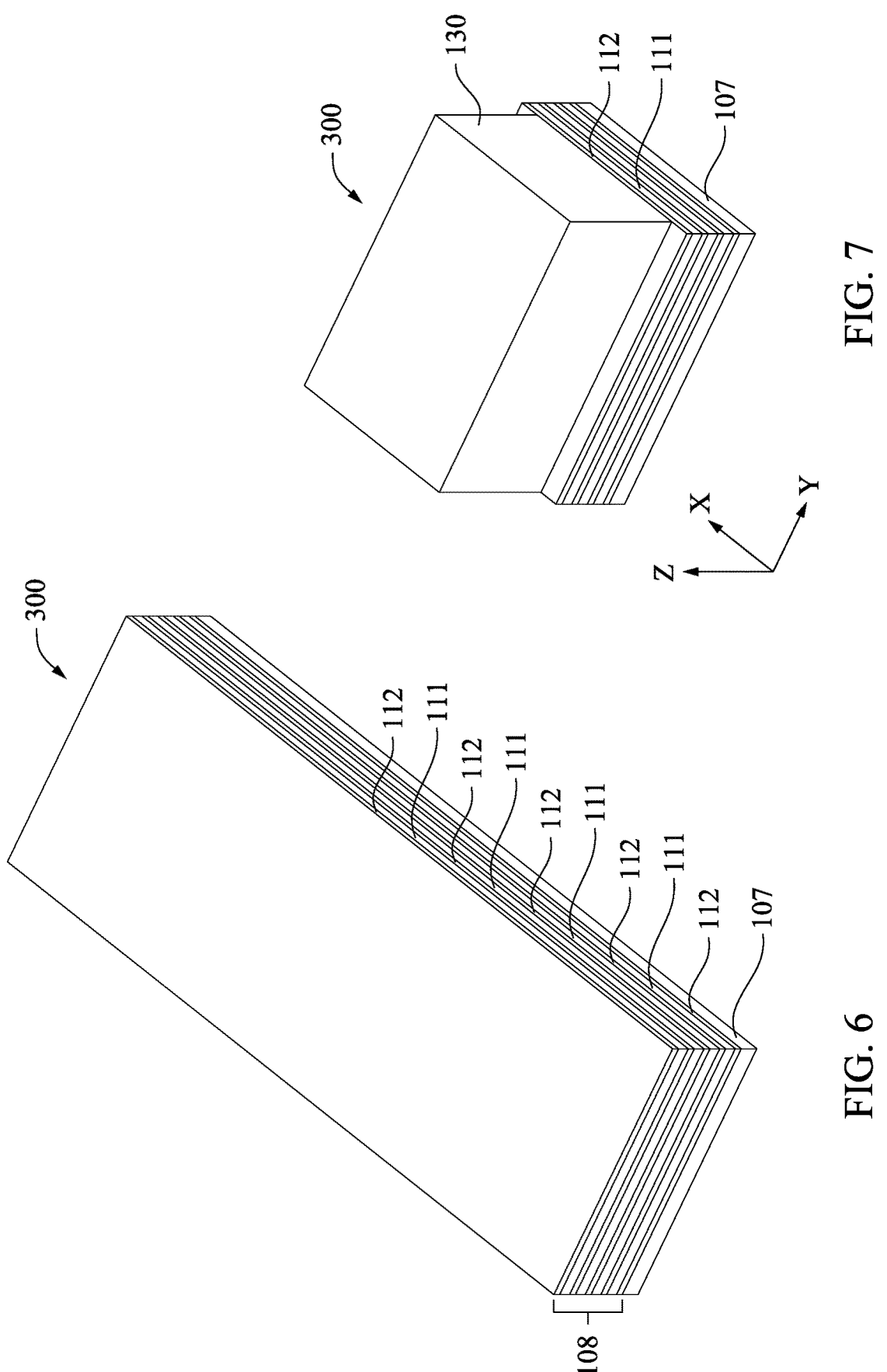
FIGS. 6, 7, 8, 9, 10, 11, 12, 13, 14, 15A, 15B, 16A, 16B, 17A, 17B, 18A, 18B, 19A, 19B, and 20 illustrate various cross-sectional views of an example semiconductor device (or a portion of the example semiconductor device) during various fabrication stages, made by the method of FIGS. 5A-5B, in accordance with some embodiments.

Expanding further, the method 200 starts with operation 202 that includes providing a substrate, for example, the substrate 107 shown in FIG. 6. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

At operation 204, a stack (e.g., the stack 108 shown in FIG. 6) is formed on the substrate 107. The stack includes a plurality of insulating layers (e.g., the insulating layers 112) and a plurality of sacrificial layers (e.g., the sacrificial layers 111 shown in FIG. 6) alternately stacked on top of each other in the vertical direction (e.g., the Z-direction). Corresponding to operations 202-204, FIG. 6 is a top, perspective view of the stack 108 disposed on the substrate 107. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIG. 6, a topmost layer (e.g., a layer distal most from the substrate 107) and a bottommost layer (e.g., a layer most proximate to the substrate 107) of the stack 108 may include an insulating layer 112. While FIG. 6 shows the stack 108 as including 5 insulating layers 112 and 4 sacrificial layers, the stack 108 may include any number of insulating layers 112 and sacrificial layers 111 (e.g., 4, 5, 6, 7, 8, or even more). In various embodiments, if the number of sacrificial layers 111 in the stack 108 is n, a number of insulating layers 112 in the stack 108 may be n+1.

Each of the plurality of insulating layers 112 may have about the same thickness, for example, in a range of about 5 nm to about 100 nm, inclusive. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive).

The insulating layers 112 and the sacrificial layers 111 have different compositions. In various embodiments, the insulating layers 112 and the sacrificial layers 111 have compositions that provide for different oxidation rates and/ or different etch selectivity between the respective layers. In some embodiments, the insulating layers 112 may be formed from SiO, and the sacrificial layers 111 may be formed from SiN. The sacrificial layers 111 are merely spacer layers that are eventually removed and do not form an active component of the semiconductor die 300.

In various embodiments, the insulating layers 112 and/or the sacrificial layers 111 may be epitaxially grown from the substrate 107. For example, each of the insulating layers 112 and the sacrificial layers 111 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 107 extends upwardly, resulting in the insulating layers 112 and the sacrificial layers 111 having the same crystal orientation as the substrate 107. In other embodiments, the insulating layers 112 and the sacrificial layers 111 may be grown using an atomic layer deposition (ALD) process.

Operations 206 to 216 involve fabrication of interface portions that have a staircase or step profile in the Z-direction. For example, at operation 206, a mask layer (e.g., the mask layer 130 shown in FIG. 7) is deposited on the stack, and is patterned. For example, as shown in FIG. 7 that shows a top, perspective view of the stack 108, the mask layer 130 is deposited on the stack 108, i.e., on the topmost insulating layer 112. In some embodiments, the mask layer 130 may include a photoresist (e.g., a positive photoresist or a negative photoresist), for example, a single layer or multiple layers of the same photoresist or different photoresists. In other embodiments, the mask layer 130 may include a hard mask layer, for example, a polysilicon mask layer, a metallic mask layer, or any other suitable mask layer.

The mask layer 130 is patterned to etch portions of the mask layer 130 at axial ends off the mask layer 130 in the X-direction, so as to reduce its axial width. The mask layer 130 may be patterned using photolithography techniques. Generally, photolithography techniques utilize a photoresist material that forms the mask layer 130 and that is deposited, irradiated (exposed), and developed to remove a portion of the photoresist material, in this instance, end portions of the mask layer 130. The remaining mask layer 130 protects the underlying material, such as a portion of the stack 108 below the patterned mask layer 130, from subsequent processing steps, such as etching.

Figure 8:
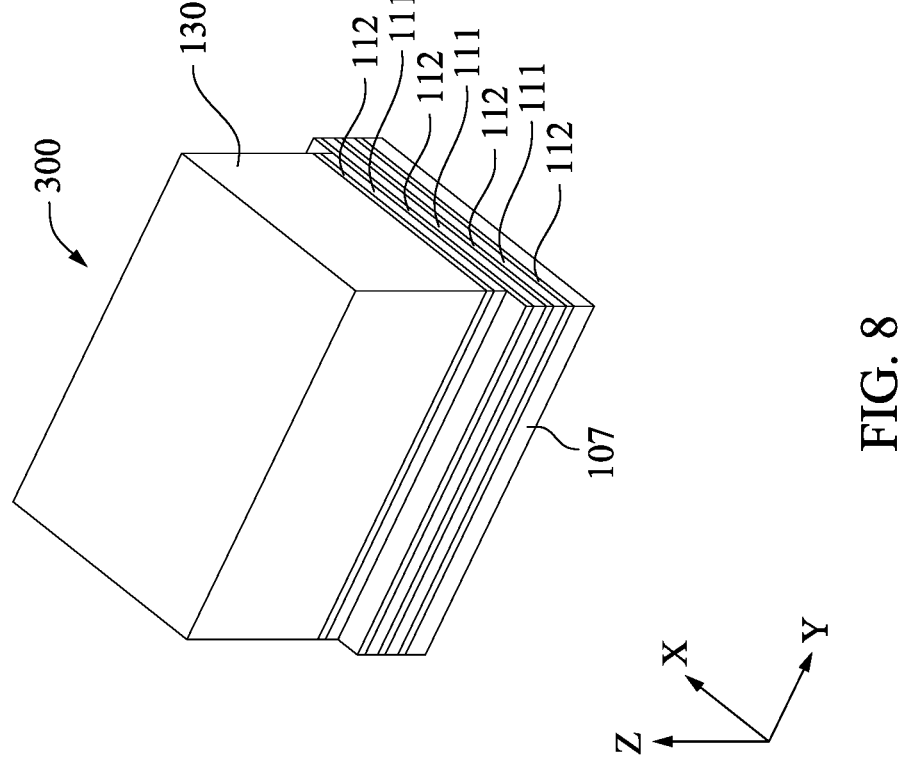

At operation 208, a first set or pair of insulating layers 112 and sacrificial layers 111 that include a topmost insulating layer 112 and a topmost sacrificial layer 111 on either side of the mask layer 130 in the X-direction, are etched. Corresponding to operation 208, FIG. 8 is a top, perspective view of the semiconductor die 300 including the stack 108 after etching the topmost insulating layer 112 and the topmost sacrificial layer 111. As shown in FIG. 8, the patterned mask layer 130 is used to etch the exposed portions of the topmost insulating layer 112 and the topmost sacrificial layer 111 included in the first set so as to form a step from the first set to a second set of insulating and sacrificial layers 112, 111 that are disposed immediately below the first set. In some embodiments, the etch may be an anisotropic etch (e.g., a reactive ion etch (RIE), neutral beam etch (NBE), deep reactive ion etch (DRIE), and the like, or combinations thereof,) which selectively etches the exposed portions of the topmost insulating and sacrificial layers 112, 111 in the Z-direction.

In some embodiments, the etching of the first set may include a first etch that selectively etches the insulating layer 112 until the underlying sacrificial layer 111 is exposed, and a second subsequent etch that etches the sacrificial layer 111 until the underlying insulating layer 112 is exposed. Such two-step etching process may allow the underlying sacrificial layer 111 or the insulating layer 112 to serve as a etch stop such that once a portion of the layer immediately above it has been removed, so as to prevent over-etching.

Figure 9:
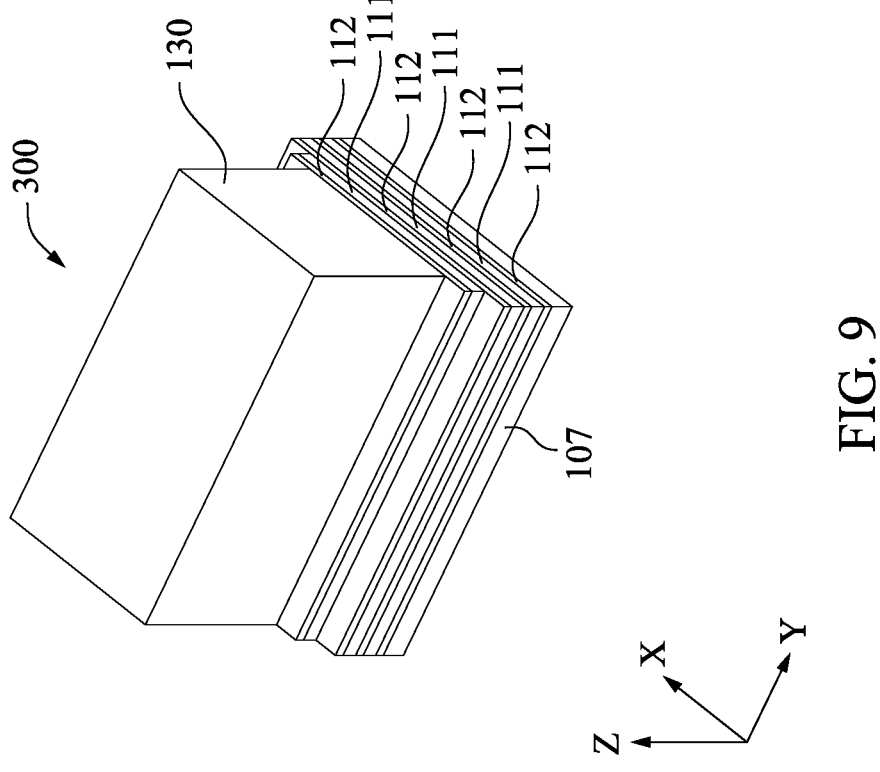

At operation 210, the mask layer 130 is again etched to reduce its width in the X-direction. Corresponding to operation 210, FIG. 9 is a top, perspective view of the semiconductor die 300 after etching the mask layer 130. As shown in FIG. 9, axial ends of the mask layer 130 may be etched using the same process as described with respect to operation 206. In some embodiments, a width of the portion of the mask layer 130 that is etched and removed at operation 210 is the same as width of a portion of the mask layer 130 that is etched and removed at operation 206.

Figure 10:
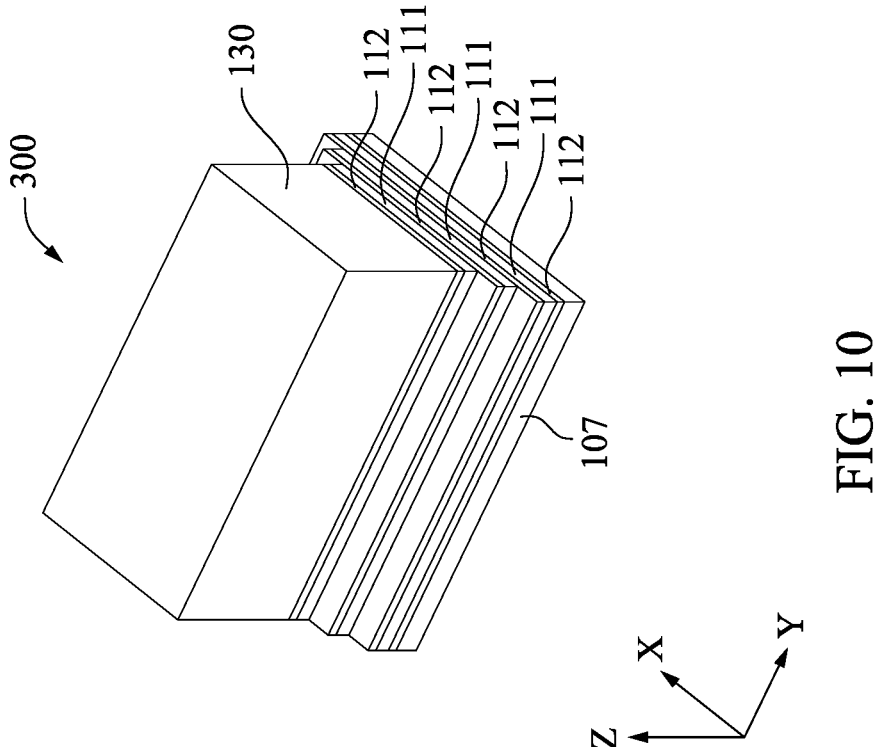

At operation 212, the first set of the insulating layer and the sacrificial layer, and the second set of the insulating layer and the sacrificial layer are etched. Corresponding to operation 212, FIG. 10 is a top, perspective view of the semiconductor die 300 after etching the first and second sets. As shown in FIG. 10, the first set of the insulating layer 112 and the sacrificial layer 111, and the second set of the insulating layer 112 and the sacrificial layer 111 are etched using the same process as described with respect to operation 208, so as to also form a step from the second set to a third set of insulating and sacrificial layers 112, 111 immediately below the second set. Moreover, the etching also causes a reduction in the length of the first set of insulating and sacrificial layers 112, 111, and the second set of insulating and sacrificial layers 112, 111, in the X-direction. The reduction in length of these layers is proportional to the reduction in width of the mask layer 130 at operation 210 in the X-direction.

Figure 11:
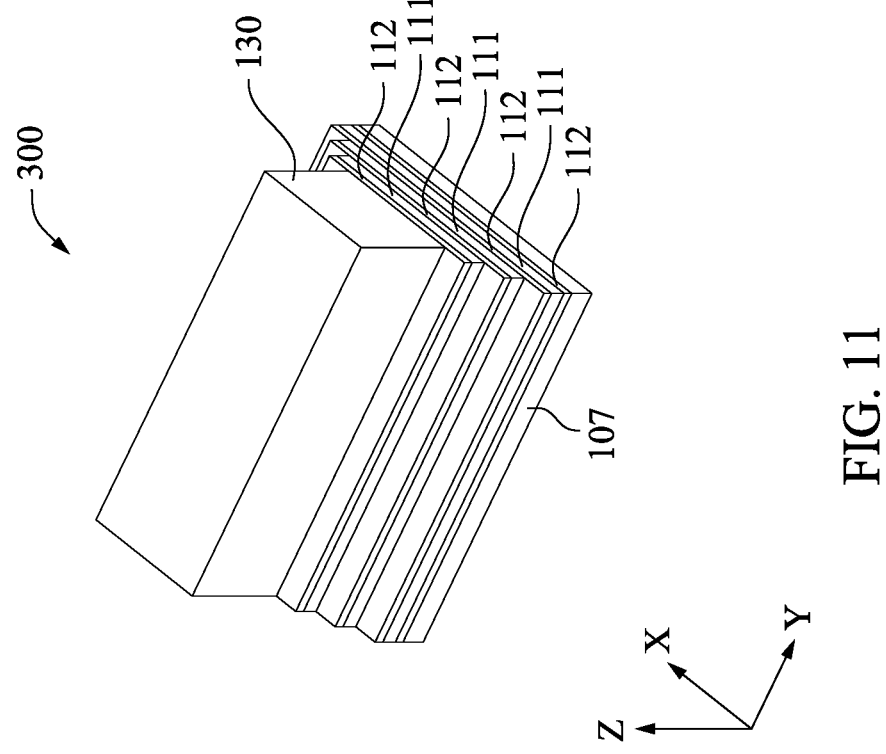

At operation 214, the operations 206-212 are repeated so as to form axial ends of the stack that have a staircase profile on either side of the mask layer 130. For example, corresponding to operation 214, FIG. 11 shows a top, perspective view of the semiconductor die 300. As shown in FIG. 11 operations 206-212 are repeated, until steps are formed from a bottommost set of insulating and sacrificial layers 112, 111 to the first set of insulating and sacrificial layers 112, 111, and axial end portions 108a and 108b of the stack 108 in the X-direction have a staircase profile, from the bottommost set to the first set (i.e., the topmost set) of insulating and sacrificial layers 112, 111. It should be appreciated that the bottommost insulating layer 112 is not included in the bottommost set of insulating and sacrificial layers 112, 111.

Figure 12:
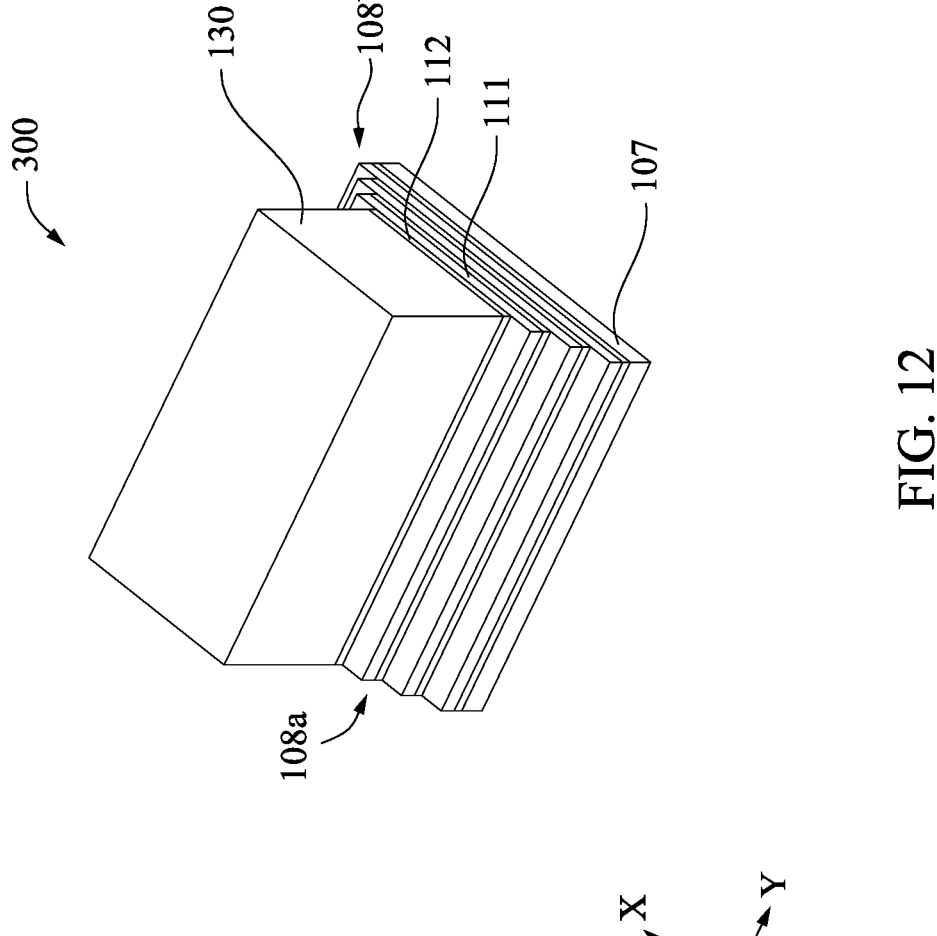
Figure 13:
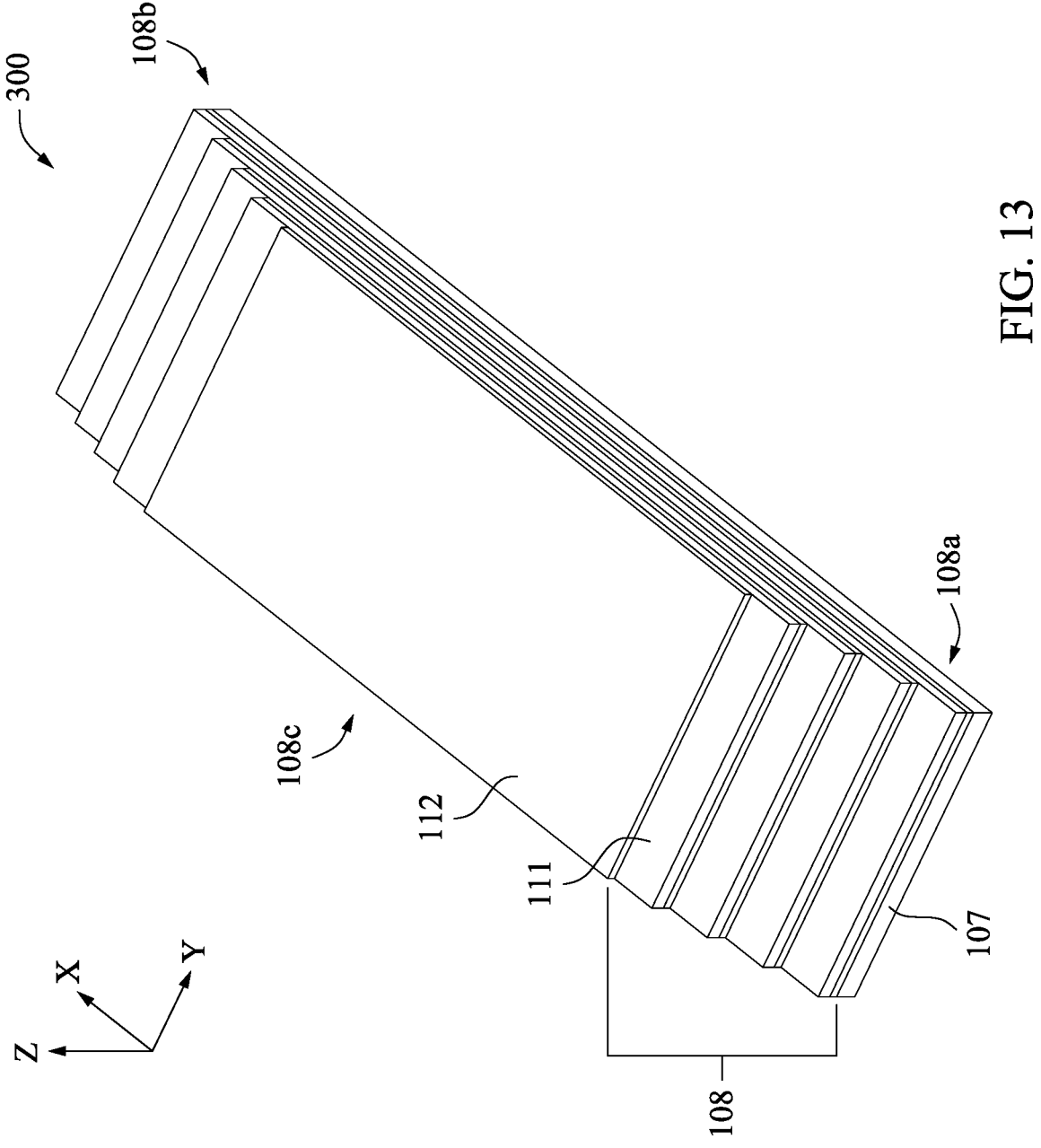

At operation 216, exposed portions of the insulating layers 112 are etched. Corresponding to operation 216, FIG. 12 is a top, perspective view of the semiconductor die 300. As shown in FIG. 12, the exposed portions of the insulating layers 112 included in the axial end portions 108a and 108b of the stack 108 on either side of the mask layer 130 in the X-direction are selectively etched (e.g., using an anisotropic etch such as RIE, NBE, DRIE, and the like, or combinations thereof.) For example, the mask layer 130 may be etched to reduce its width and exposed portion of the insulating layers 112 on either side of the mask layer 130 are etched to expose a portion of each sacrificial layer 111 that is located in the axial end portions 108a and 108b below the etched portions of the insulating layers 112. The axial end portions 108a and 108b later form the interface portions 106a and 106b of the semiconductor die 300, as shown in FIG. 13. The mask layer 130 is then removed (e.g., via an isotropic etch in solvent or etchant.) An array of memory devices 110 are formed in a central portion 108c portion of stack 108 located between the axial end portions 108a and 108b so as to form first semiconductor device 102a and the second semiconductor device 102b in later operations described herein.

Figure 14:
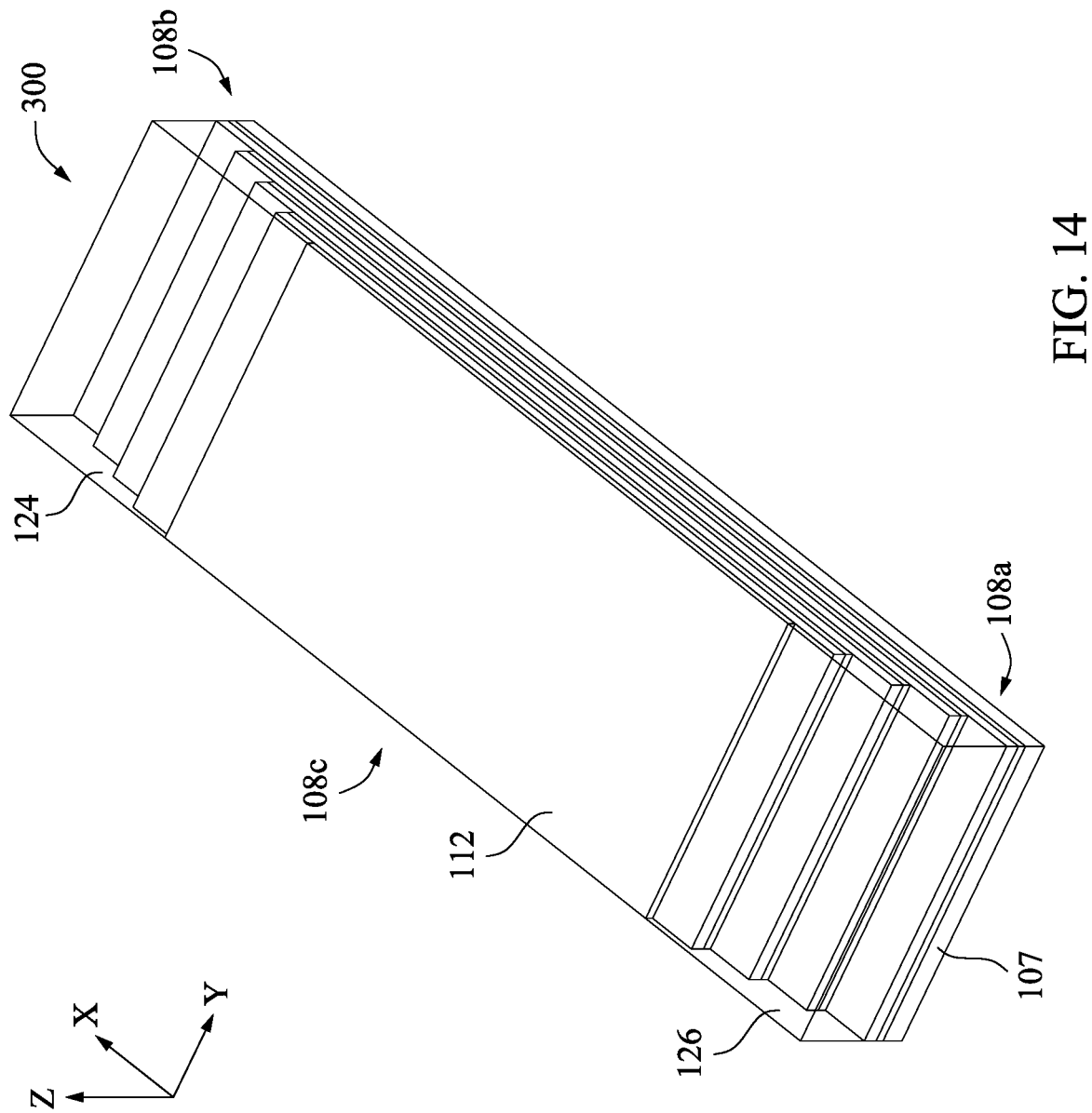

At operation 218, an ILD is deposited on the axial ends of the stack that have the staircase profile. Corresponding to operations 218, FIG. 14 is a top, perspective view of the semiconductor die 300 after formation of the ILD 126. The ILD 126 is deposited on the axial end portions 108a and 108b. The ILD 126 can be formed by depositing a dielectric material in bulk over the partially formed semiconductor die 300 (e.g., a 3D GAA memory device), and polishing the bulk oxide back (e.g., using CMP) to the level off the topmost insulating layer 112 such that the ILD is only disposed on the axial end portions 108a and 108b. The dielectric material of the ILD 126 may include SiO, phosphosilicate glass (PSG), borosilicate glass (BSG), boron-doped phosphosilicate Glass (BPSG), undoped silicate glass (USG), or combinations thereof.

Figures 15A, 15B:
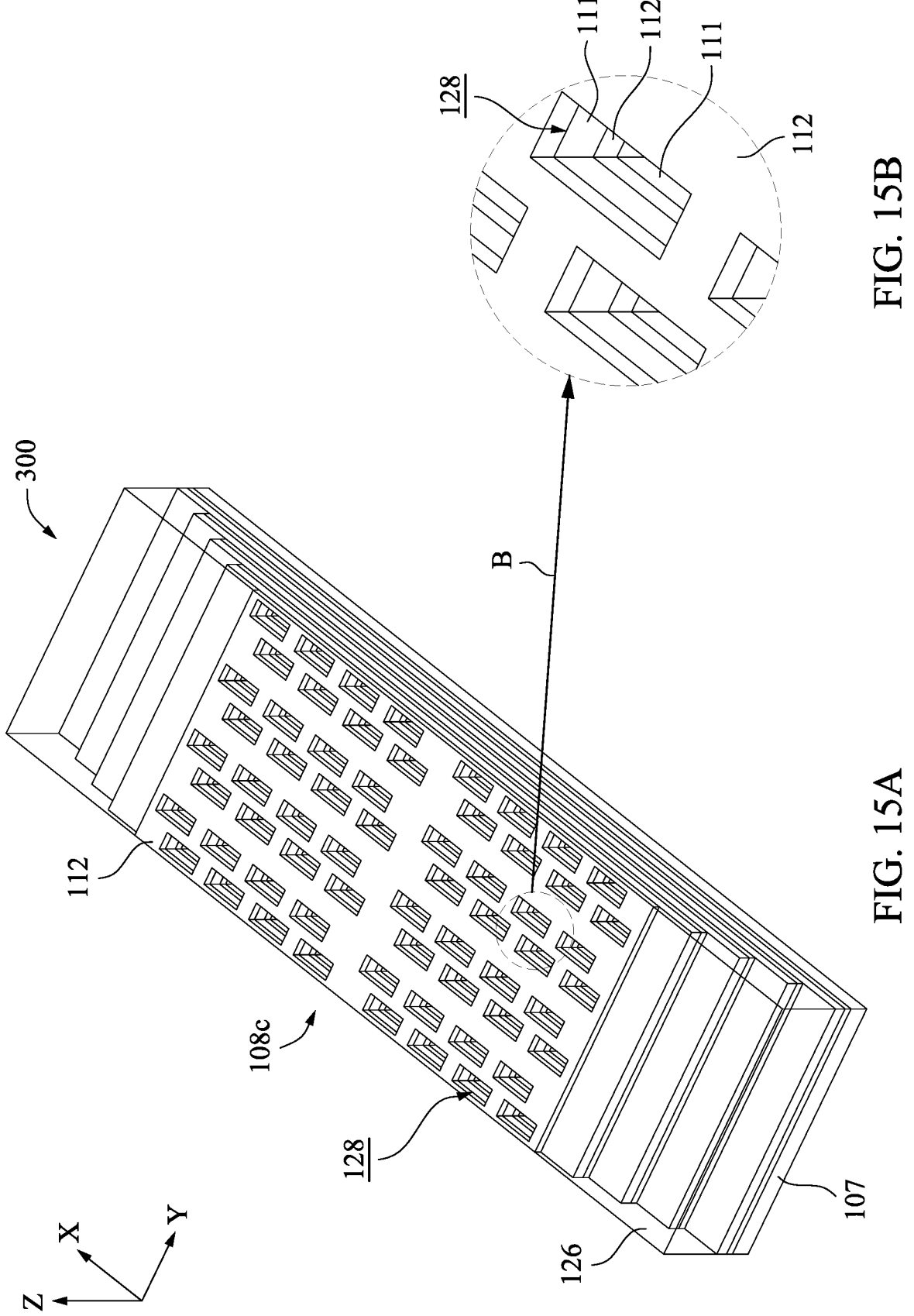

At operation 220, an array of cavities is etched through the stack between the interface portions. Corresponding to operation 220, FIG. 15A is a top, perspective view after the array of cavities 128 have been formed in the central portion 108c of the stack 108, and FIG. 15B is an enlarged view of a portion of the semiconductor die 300 indicated by the arrow B. As shown in FIG. 15A, an array of cavities 128 is formed through the central portion 108c of the stack 108 in the vertical direction (i.e., the Z-direction.) The etching process for forming the cavities 128 may include a plasma etching process, which can have a certain amount of anisotropic characteristic. For example, the cavities 128 may be formed by etching the central portion of the stack 108 using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the cavities 128. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

As shown in FIG. 15B, the etch used to form the array of cavities 128 etches through each of the sacrificial layers 111 and insulating layers 112 of the stack 108 such that each of the cavities 128 extend form the topmost insulating layer 112 through the bottommost insulating layer 112 to the substrate 107.

At operation 222, a memory layer (e.g., the memory layer 114) is deposited on walls of each of the cavities (e.g., the cavities 128). At operation 224, a channel layer (e.g., the channel layer 116) is deposited on a radially inner surface of the memory layer (e.g., the memory layer 114). At operation, 226, an inner spacer (e.g., the inner spacer 118) is formed within each of the cavities by filling each of the cavities with an insulated material. In this manner, a device structure is formed in each of cavities.

Figures 16A, 16B:
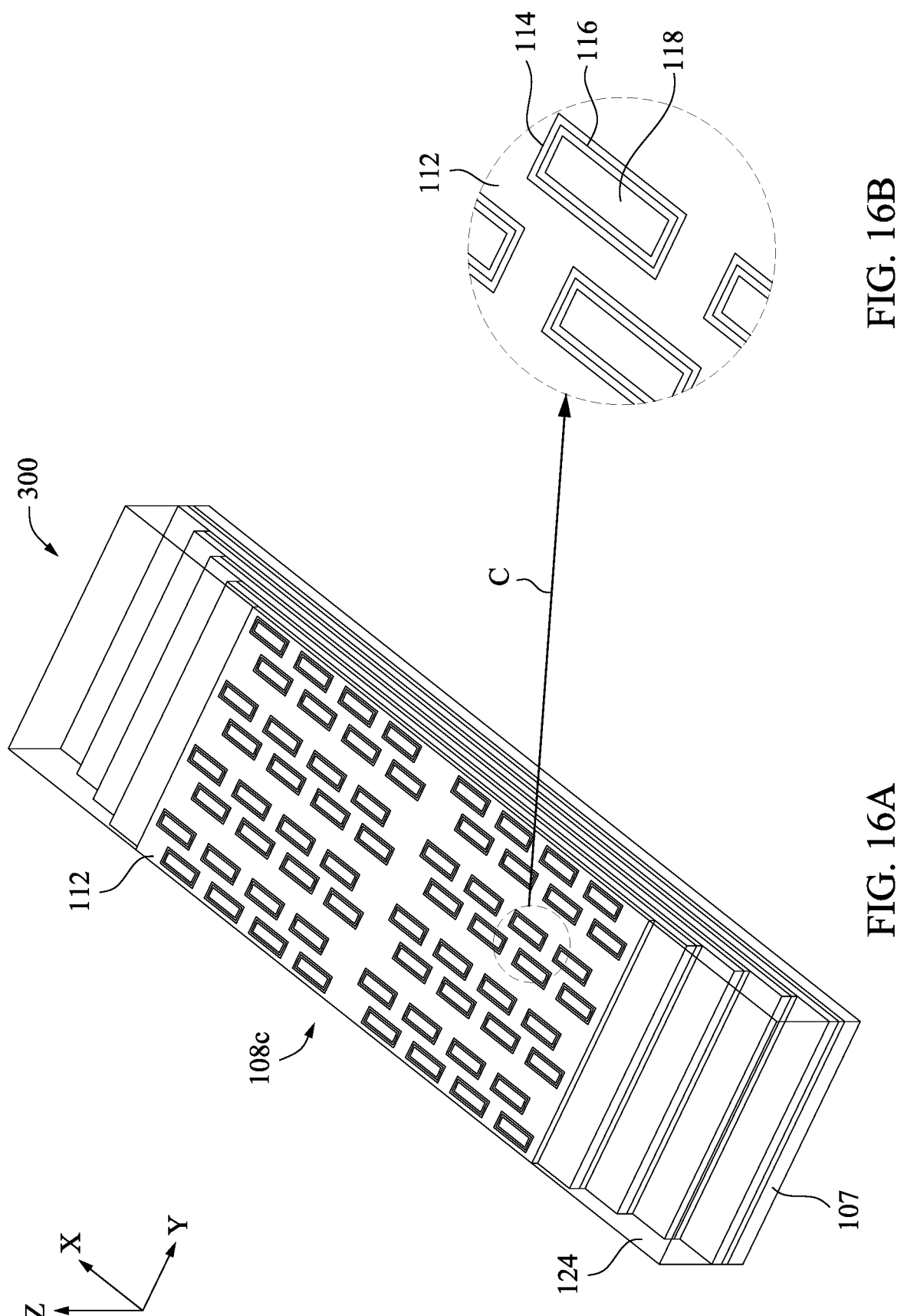

Corresponding to operations 222-226, FIG. 16A shows a top view of the semiconductor die 300, and FIG. 16B shows an enlarged view of a portion of the semiconductor die 300 indicated by the arrow C. As shown in FIG. 16B, the memory layer 114 is first disposed on walls of each of the cavities 128. The memory layer 114 may include a ferroelectric material, for example, lead zirconate titanate (PZT), $PbZr/TiO_3$, $BaTiO_3$, $PbTiO_2$, etc. The memory layer 114 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 114 is continuous around the walls of the cavities.

The channel layer 116 is formed on radially inner surfaces of the memory layer 114. In some embodiments, the channel layer 116 may be formed from a semiconductor material, for example, Si (e.g., polysilicon or amorphous silicon), Ge, SiGe, silicon carbide (SiC), etc. The channel layer 116 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layer 116 is continuous on the radially inner surfaces of the memory layer 114. Each of the cavities 128 is then filled with an insulating material (e.g., SiO, SiN, SiON, SiCN, SiC, SiOC, SiOCN, the like, or combinations thereof) so as to form the inner spacer 118. In some embodiments, the inner spacer 118 may be formed from the same material as the plurality of insulating layers 112. The inner spacer 118 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figures 17A, 17B:
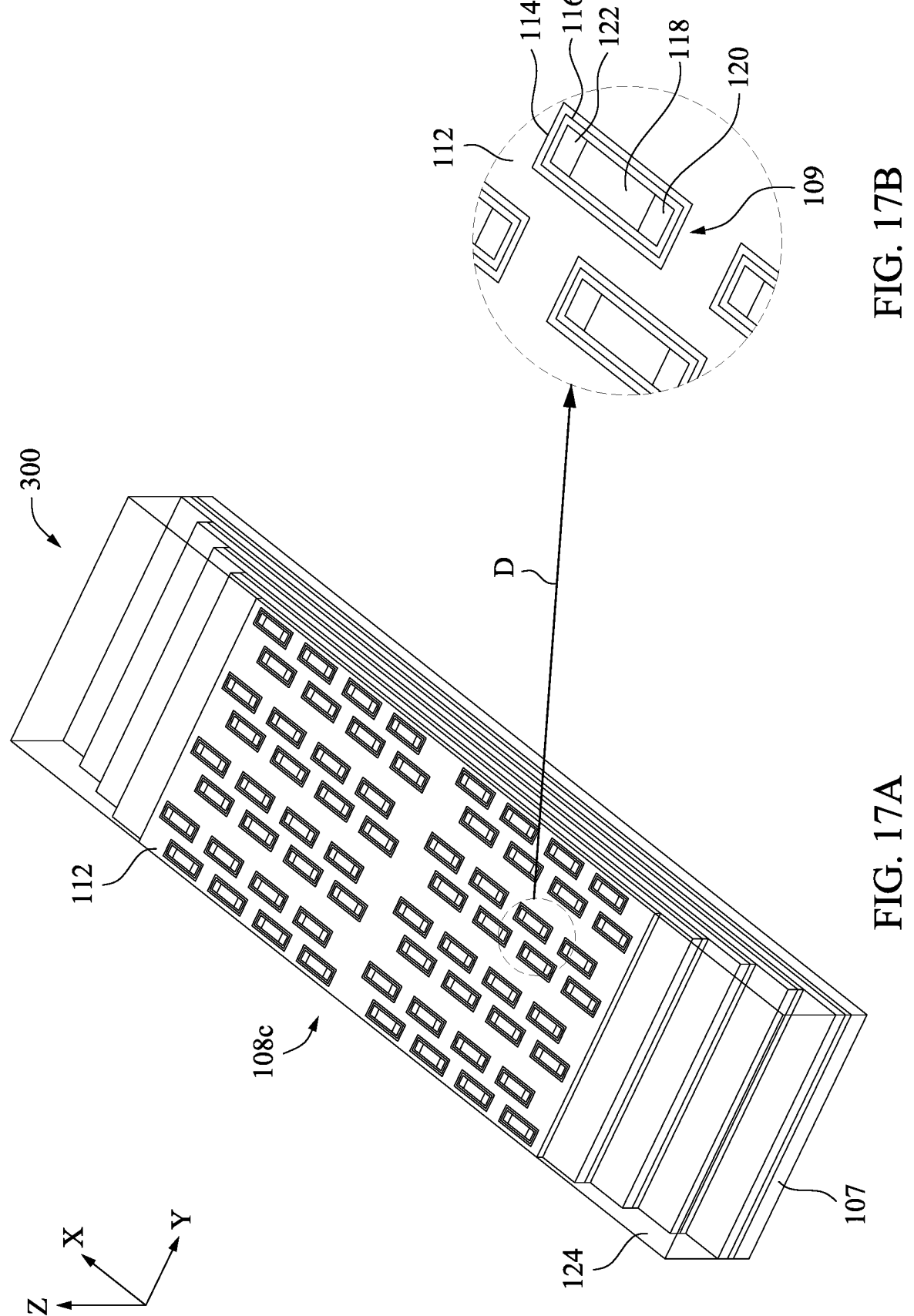

At operation 228, a source and a drain are formed through the inner spacer on opposite axial ends of the inner spacer so as to form an array of devices structures between axial ends of the stack. Corresponding to operation 228, FIG. 17A is top, perspective view of the semiconductor die 300, and FIG. 17B is an enlarged view of a portion of the semiconductor die 300 indicated by the arrow D. As shown in FIG. 17B, the source 120 and the drain 122 may be formed by first etching through axial ends of the inner spacer 118 to the substrate 107. The axial ends of the inner spacer 118 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Next, the source 120 and the drain 122 may be formed, for example, using an epitaxial layer growth process such that the source 120 and the drain 122 are located on opposite axial ends of the inner spacer 118 and extend from the substrate 107 to a top surface of the inner spacer 118 so as to form an array of device structures 109. In some embodiments, a control deposition step may be performed for forming the source 120 and the drain 122 such that the deposition step is stopped when a height of the source 120 and the drain 122 in the Z-direction are equal to a height of the stack 108. In other embodiments, a CMP operation may be performed after formation of the source 120 and the drain 122 so as to ensure a top surface of each of the topmost insulating layer 112, the memory layer 114, the channel layer 116, the inner spacer 118, the source 120, and the drain 122 lie in the same X-Y plane or are level with a top surface of the topmost insulating layer 112. In still other embodiments, a top surface of the source 120 and the drain 122 may be higher than a top surface of the topmost insulating layer 112. In some other embodiments, the top surface of the source 120 and the drain 122 may be lower than the top surface of the topmost insulating layer 112.

In-situ doping (ISD) may be applied to form doped source 120 and drain 122, thereby creating the junctions for each memory device 110 formed from the device structures 109. N-type and p-type FETs are formed by implanting different types of dopants to selected regions (e.g., the source 120 and the drain 122) of the device structure 109 to form the junction(s). N-type devices can be formed by implanting arsenic (As) or phosphorous (P), and p-type devices can be formed by implanting boron (B).

At operation 230, a plurality of first trenches are formed through the stack (e.g., the stack 108) in the first direction (e.g., the X-direction) between each row of device structures (e.g., the device structures 109) included in the array, and a second trench is formed through the stack in a second direction perpendicular to the first direction (e.g. the Y-direction). The second trench divides the array into a first sub-array of devices structures included in a first device portion (e.g., the first device portion 104*a*) and a second sub-array of device structures included in a second device portion (e.g., the second device portion 104*b*,) the second device portion being electrically isolated from the first device portion.

Figures 18A, 18B:
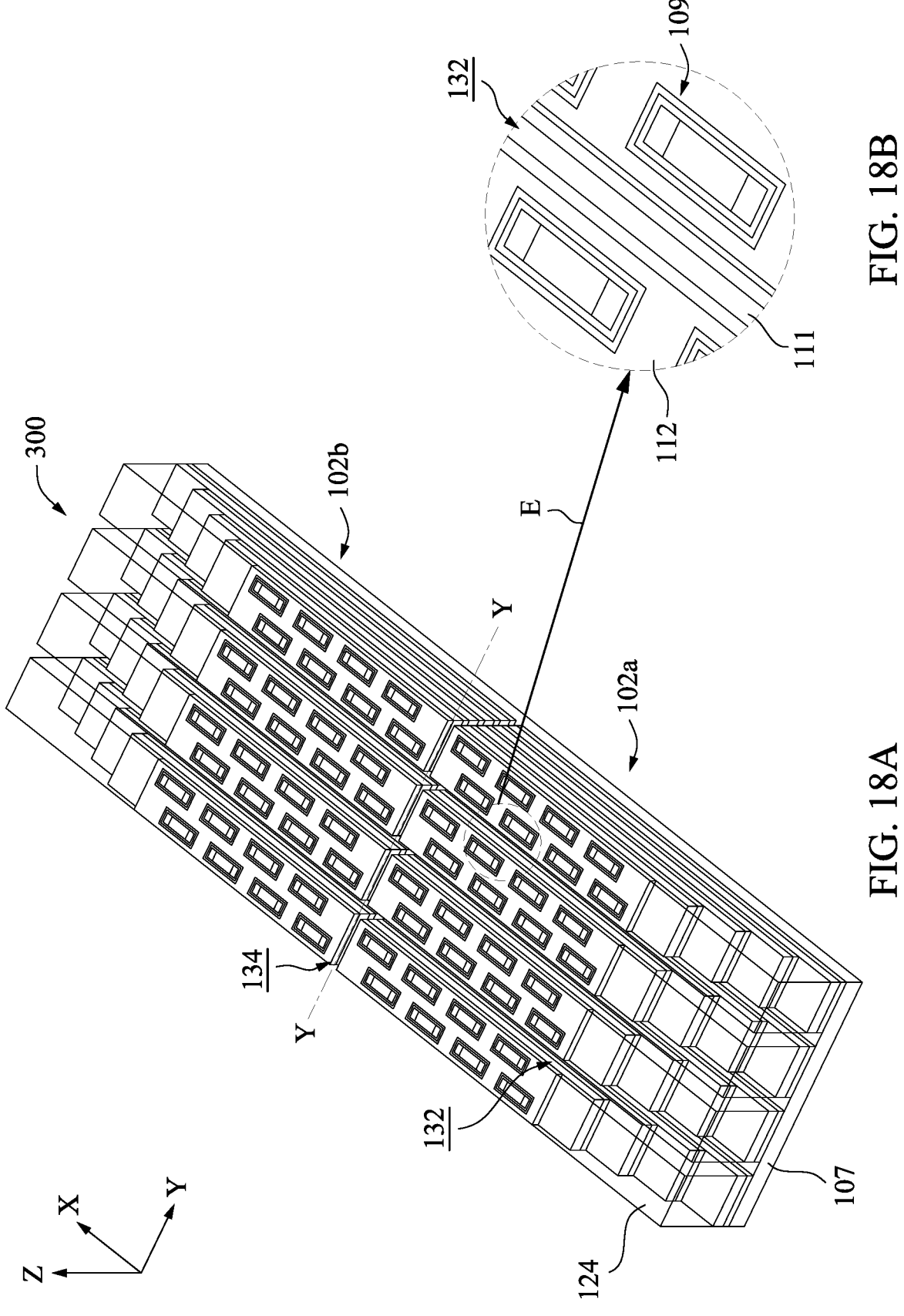

Corresponding to operation 230, FIG. 18A is a top, perspective view of the semiconductor die 300 showing a plurality of first trenches 132, and the second trench 134 formed therein, and FIG. 18B is an enlarged view of a portion of the semiconductor die 300 indicated by the arrow E. As shown in FIG. 18A, the plurality of first trenches 132 extend in the X-direction and are formed by etching through the stack 108 and the ILD 126 in the Z-direction. Moreover, the second trench 134 extends in the Y-direction and is formed by etching through the stack 108 such that the second trench 134 divides the semiconductor into two portions along the line Y-Y shown in FIG. 18A—a first portion which will form the first semiconductor device 102*a* on one side of the line Y-Y in the X-direction, and a second portion which will form the second semiconductor device 102*b* on the other side of the line Y-Y in the X-direction. In some embodiments, the second trench 134 is formed at a location such that an equal number of device structures 109 are included in each of the first semiconductor device 102*a* and the second semiconductor device 102*b*. In other embodiments, the second trench 134 may be formed at a location such that an unequal number of device structures 109 are included in the first semiconductor device 102*a* relative to the second semiconductor device 102*b*.

The plurality of first trenches 132 and the second trench 134 may be formed simultaneously through the stack 108 as well as the ILD 126. The stack 108 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 132 and the second trench 134. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figures 19A, 19B:
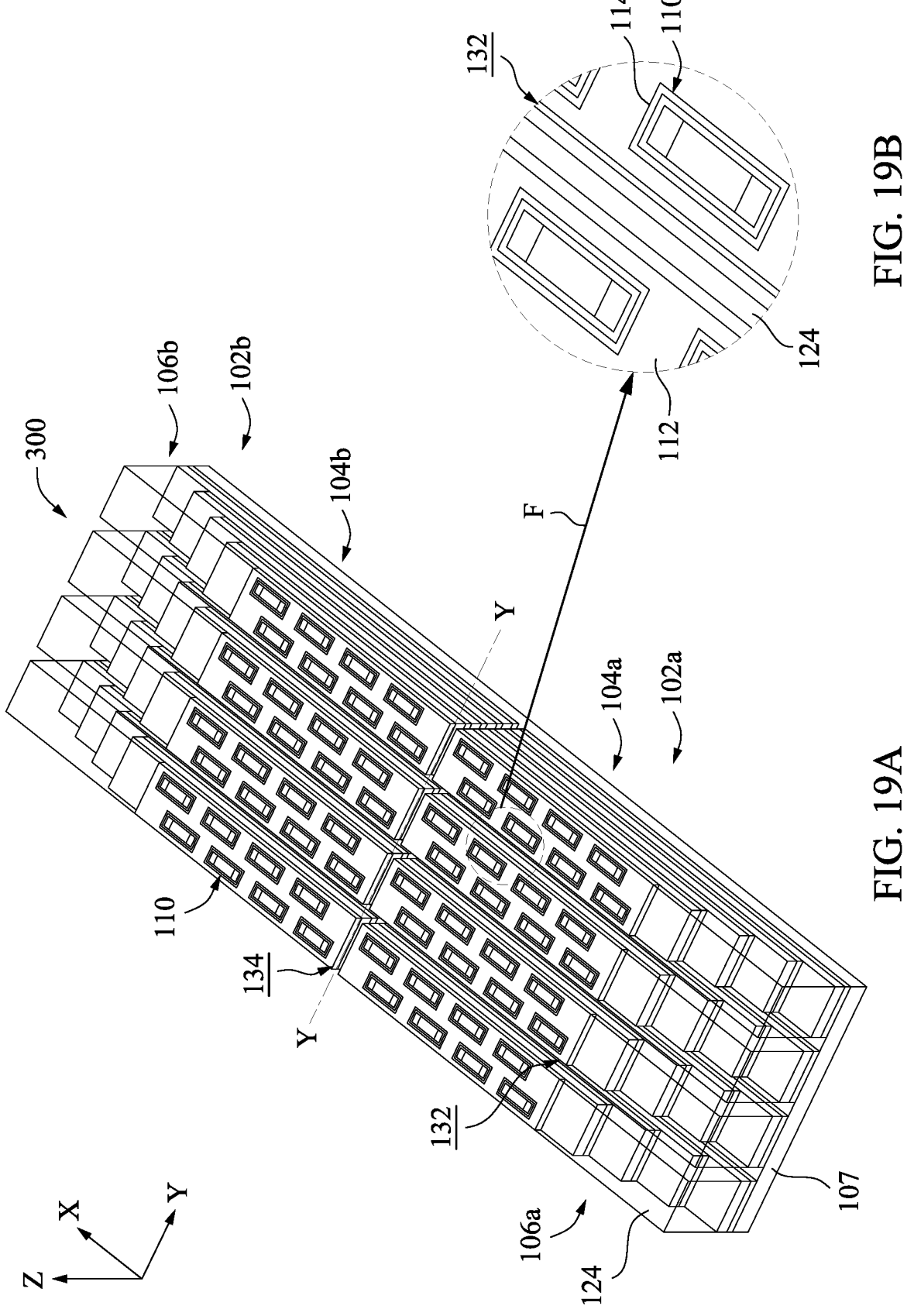

At operation 232, gate layers are formed by replacing the sacrificial layers so as to form a first sub-array of memory devices located in a first device portion and a second sub-array of memory devices located in a second device portion that is electrically isolated from the first device portion. Corresponding to operation 232, FIG. 19A is a top, perspective view of the semiconductor die 300 showing gate layers 124 formed by replacing the sacrificial layers 111 so as to form the sub-array of memory devices 110 in each of the first device portion 104*a* of the first semiconductor device 102*a*, and the second device portion 104*b* of the second semiconductor device 102*b*, and FIG. 19B is an enlarged view of a portion of the semiconductor die 300 indicated by the arrow F. As shown in FIG. 19B, the plurality of insulating layers 112 and the plurality of gate layers 124 of the stack 108 are wrapped around the memory layer 114 of each of the memory devices 110 included in a corresponding row within the first semiconductor device 102*a* or the second semiconductor device 102*b*.

In various embodiments, the gate layers 124 are formed by filling a gate dielectric and/or gate metal in the areas where the sacrificial layers 111 were present while leaving other structures such as the insulating layers 112, the memory layer 114, the channel layer 116, the inner spacer 118, the source 120, and the drain 122 substantially intact, such that the gate layers 124 inherit the dimensions and profiles of the respective sacrificial layer 111 that a gate layer 124 replaces.

In various embodiments, the gate layers 124 may be formed from a high-k dielectric material. Although, each of gate layer 124 shown in FIG. 19B is shown as a single layer, in other embodiments, the gate layer 124 can be formed as a multi-layer stack (e.g., including a gate dielectric layer and a gate metal layer), while remaining within the scope of the present disclosure. The gate layers 124 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate layers 124 can be deposited using any suitable method, including, for example, molecular beam deposition (MBD), atomic layer deposition (ALD), PECVD, and the like.

In some embodiments in which the gate layers 124 includes a gate dielectric and a gate metal, the gate metal can wrap around the memory layer 114 in a corresponding row, with the gate dielectric disposed therebetween. Specifically, the gate metal can include a number of gate metal sections abutted to each other along the vertical direction. Each of the gate metal sections can extend not only along a horizontal plane (e.g., the plane expanded by the X-direction and the Y-direction), but also along the vertical direction. As such, two adjacent ones of the gate metal sections can adjoin together to wrap around a corresponding one of the memory layer 114, with the gate dielectric disposed therebetween.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

As shown in FIG. 19A, each row of memory devices 110 are separated by a first trench 132. The first sub-array of memory devices 110 is electrically coupled to the first interface portion 106*a*, and the second sub-array of memory devices 110 is electrically coupled to the second interface portion 106*b*. Expanding further, the gate layer 124 of each row included in the first semiconductor device 102*a* and the second semiconductor device 102*b* is electrically coupled to each of the memory devices 110 in that row, and wraps around the memory layer 114 of each memory device 110 in that row. A gate layer 124 of each row in the first semiconductor device 102*a* extends from the first device portion 104*a* of the first semiconductor device 102*a* to the first interface portion 106*a* of the first semiconductor device 102*a*, beneath the corresponding ILD 126. Similarly, a gate layer 124 of each row in the second semiconductor device 102*b* extends from the second device portion 104*b* of the second semiconductor device 102*b* to the second interface portion 106*b* of the second semiconductor device 102*b*, beneath the corresponding ILD 126. However, because of the second trench 134, a gate layer 124 of one row of the first semiconductor device 102*a* is electrically isolated from a gate layer 124 of a corresponding row of the second semiconductor device 102*b*.

Figure 20:
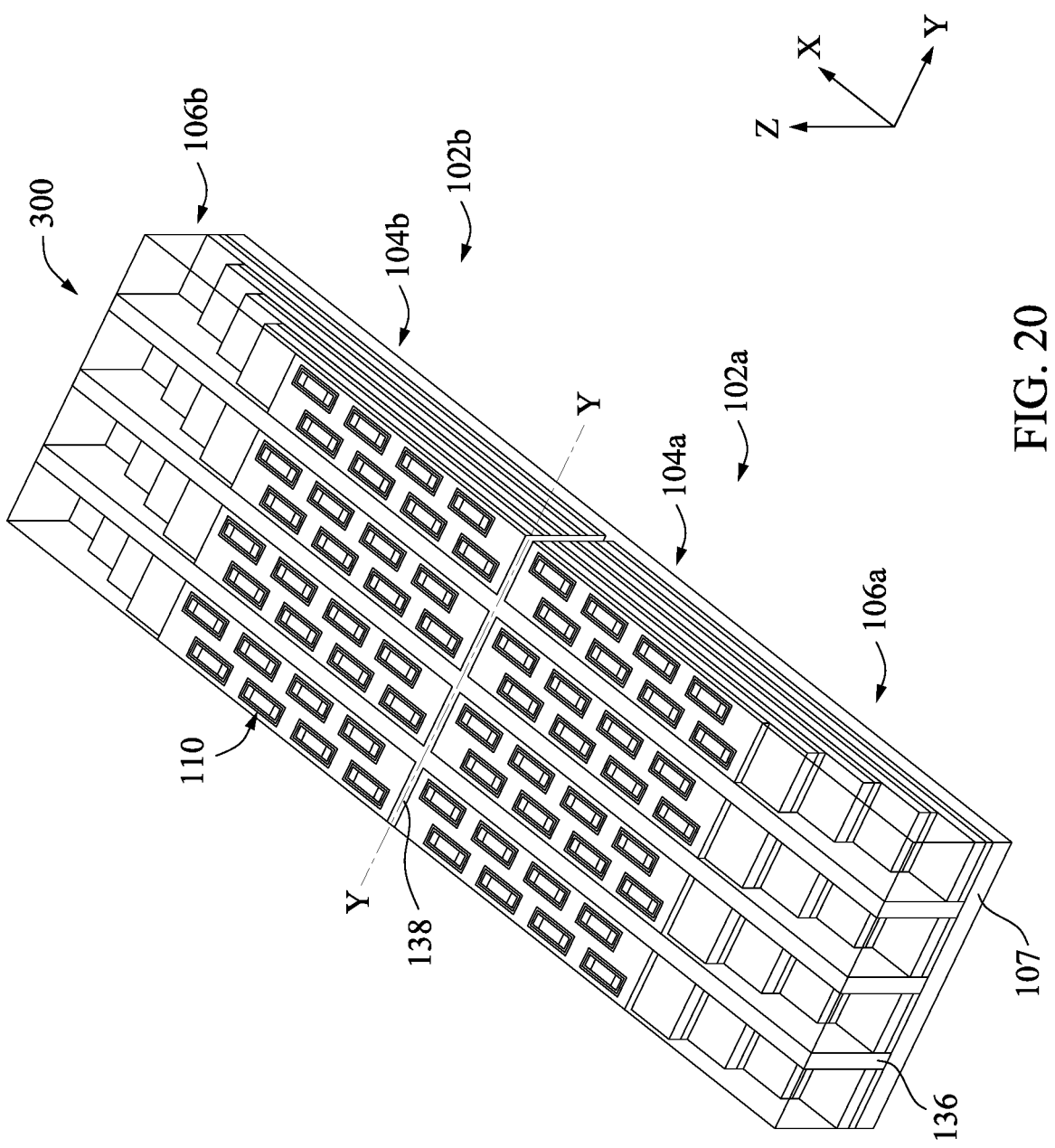

At operation 234, the plurality of first trenches 132 and the second trench 134 is filled with an insulating material. Corresponding to operation 234, FIG. 20 shows a top perspective view of the final semiconductor die 300 after depositing the insulating material in the first trenches 132 and the second trench 134. The insulating material may be deposited by CVD, physical vapor deposition (PVD), ALD, and/or other suitable process. In some embodiments, the insulating material may be the same material that forms the insulating layers 112 (e.g., SiO, SiN, SiON, SiCN, SiC, SiOC, SiOCN, the like, or combinations thereof).

As shown in FIG. 20, deposition of the insulation material in the second trench 134 results in the formation of the isolation wall 138 that divides the first device portion 104*a* and thereby, the first semiconductor device 102*a* from the second device portion 104*b* and thereby, the second semiconductor device 102*b*. However, unlike existing semiconductor dies where a semiconductor device includes a first active interface portion on one axial end in the X-direction, which is used to provide electrical interface, and a second inactive interface portion on the opposite axial which plays no part in the device, each of the first semiconductor device 102*a* and the second semiconductor device 102*b* include a single active interface portion 106*a* and 106*b*, respectively. This results in less area of the wafer used to form the first semiconductor device 102*a* and the second semiconductor device 102*b*, thereby providing chip area saving and increasing the number of dies per wafer, thereby, increasing throughput. In addition, a plurality of horizontal isolation walls 136 are also formed by filling the plurality of first trenches 132 with the insulating material. Each of the plurality of horizontal isolation walls 136 electrically isolate adjacent rows of memory devices 110 from each other.

In some embodiments, a semiconductor die comprises a first semiconductor device, comprising: a first device portion comprising a first sub-array of memory devices, and a first interface portion located adjacent to the first device portion in a first direction, the first interface portion having a staircase profile in a vertical direction. A second semiconductor device, comprises: a second device portion adjacent to the first device portion in the first direction opposite the first interface portion, the second device portion comprising a second sub-array of memory devices, and a second interface portion located adjacent to the second device portion in the first direction opposite the first interface portion, the second interface portion also having a staircase profile in the vertical direction. The first semiconductor device is electrically isolated from the second semiconductor device.

In some embodiments, a method of making a semiconductor die comprises: providing a stack comprising a plurality of insulating layers and a plurality of sacrificial layers alternatively stacked on top of each other. The method comprises forming a first interface portion on a first end and a second interface portion on a second end of the semiconductor die opposite the first end in a first direction, each of the first interface portion and the second interface portion having a staircase profile in a vertical direction. An array of device structures is formed between the first interface portion and the second interface portion. A plurality of first trenches are formed through the stack in the first direction between each row of device structures included in the array of device structures, and a second trench is formed through the stack in a second direction perpendicular to the first direction, the second trench dividing the array of device structures into a first sub-array of devices structures included in a first device portion and a second sub-array of device structures included in a second device portion, the second device portion being electrically isolated from the first device portion. Gate layers are formed by replacing the sacrificial layers so as to form a first sub-array of memory devices in the first device portion and a second sub-array of memory devices in the second device portion. The plurality of first trenches and the second trench are filled with an insulating material.

In some embodiments, a method of making a semiconductor die comprises: providing a stack comprising a plurality of insulating layers and a plurality of sacrificial layers alternatively stacked on top each other such that one of the plurality of insulating layers forms a bottommost layer, and another one of the plurality of insulating layers forms a topmost layer of the stack. The method comprises forming a first interface portion on a first end and a second interface portion on a second end of the semiconductor die opposite the first end in a first direction, each of the first interface portion and the second interface portion having a staircase profile in a vertical direction. An array of cavities are etched through the stack between the first interface portion and the second interface portion. A device structure is formed in each of the cavities so as to form an array of device structures. The array of device structures are divided into a first sub-array and a second sub-array of device structures. A plurality of gate layers are formed by replacing the plurality of sacrificial layers so as to form a first sub-array of memory devices located in a first device portion and a second sub-array of memory devices located in a second device portion that is electrically isolated from the first device portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor die, comprising:
    forming a first staircase profile on a first end of a semiconductor die and a second staircase profile on a second end of the semiconductor die opposite the first end in a first horizontal direction;
    forming an array of memory devices structures interposed between the first staircase profile and the second staircase profile in the first horizontal direction;
    forming a plurality of first trenches, extending in the first horizontal direction, into at least a bottommost layer of the semiconductor die, and a second trench extending in a second horizontal direction perpendicular to the first horizontal direction and having sidewalls substantially coplanar or vertical with the array of memory device structures, with each of the plurality of first trenches being intersected by the second trench; and
    filling the plurality of first trenches and the second trench with an insulating material,
    wherein the second trench divides the array of memory devices structures into a first sub-array of memory devices adjacent to the first staircase profile formed on the first end of the semiconductor die and a second sub-array of memory devices adjacent to the second staircase profile formed on the second end of the semiconductor die in the first horizontal direction, and wherein (i) a first pair of the first sub-array of memory devices and the first staircase profile formed on the first end of the semiconductor die and (ii) a second pair of the second sub-array of memory devices and the second staircase profile formed on the second end of the semiconductor die are spaced from each other in the first horizontal direction by only the second trench filled with the insulating material.

2. The method of claim 1, wherein a first interface portion formed with the first staircase profile is electrically coupled to the first sub-array of memory devices, and a second interface portion formed with the second staircase profile is electrically coupled to the second sub-array of memory devices.

3. The method of claim 1, wherein each of the memory devices comprises:
    a source;
    a drain spaced apart from the source in the first horizontal direction;
    an inner spacer extending between the source and the drain;

a channel layer disposed on radially outer surfaces of the source, the drain, and the inner spacer;
    a memory layer disposed on a radially outer surface of the channel layer; and
    a plurality of insulating layers and a plurality of gate layers of a stack wrapping around the memory layer.

4. The method of claim 3, wherein each of a topmost layer and a bottommost layer of the stack comprises an insulating layer of the insulating layers.

5. The method of claim 3, wherein each of the memory devices has a rectangular shape or a square shape in an X-Y plane.

6. The method of claim 5, wherein axial ends of each of the memory devices are rounded.

7. The method of claim 3, wherein each of the memory devices has an oval shape, an elliptical shape, or a circular shape in the X-Y plane.

8. A method of making a semiconductor die, comprising:
    providing a stack comprising a plurality of insulating layers and a plurality of sacrificial layers alternatively stacked on top of each other in a vertical direction;
    forming a first interface portion on a first end and a second interface portion on a second end of the stack opposite to the first end in a first horizontal direction;
    forming an array of device structures between the first and second interface portions, wherein the first and second interface portions include first and second staircase profiles, respectively;
    forming a plurality of first trenches into at least a bottommost layer of the stack, the plurality of first trenches extending in the first horizontal direction and a second trench extending in a second horizontal direction perpendicular to the first horizontal direction and having sidewalls substantially coplanar or vertical with the array of device structures, with each of the plurality of first trenches being intersected by the second trench; and
    filling the plurality of first trenches and the second trench with an insulating material,
    wherein forming the second trench divides the array of device structures into a first sub-array of device structures adjacent to the first staircase profile and a second sub-array of device structures adjacent to the second staircase profile, and (i) a first pair of the first sub-array of device structures and the first staircase profile and (ii) a second pair of the second sub-array of device structures and the second staircase profile are spaced from each other in the first horizontal direction by only the second trench filled with the insulating material.

9. The method of claim 8, wherein the first and second staircase profiles are formed in the vertical direction.

10. The method of claim 8, wherein the first sub-array of devices structures and the second sub-array of devices structures are electrically isolated from each other by only the second trench filled with the insulating material.

11. The method of claim 8, further comprising:
    forming a plurality of gate layers by replacing the plurality of sacrificial layers;
    wherein the plurality of gate layers each extend in the first horizontal direction.

12. The method of claim 11, wherein each of the device structures comprises:
    a source;
    a drain spaced apart from the source in the first horizontal direction;
    an inner spacer extending between the source and the drain;

a channel layer disposed on radially outer surfaces of the source, the drain, and the inner spacer;

a memory layer disposed on a radially outer surface of the channel layer; and the plurality of insulating layers and the plurality of gate layers of the stack wrapping around the memory layer.

13. The method of claim 12, wherein the source, the drain, the inner spacer, the channel layer, and the memory layer each extend in the vertical direction.

14. The method of claim 12, wherein the memory layer includes a ferroelectric material.

15. A method of making a semiconductor die, comprising:

providing a stack comprising a plurality of insulating layers and a plurality of sacrificial layers alternatively stacked on top of each other in a vertical direction;

forming a first interface portion on a first end and a second interface portion on a second end of the stack opposite to the first end in a first horizontal direction, wherein the first interface portion and the second interface portion have first and second staircase profiles, respectively, in the vertical direction;

forming an array of device structures between the first and second interface portions;

concurrently forming a plurality of first trenches into at least a bottommost layer of the stack, the plurality of first trenches extending in the first horizontal direction and a second trench extending in a second horizontal direction perpendicular to the first horizontal direction and having sidewalls substantially coplanar or vertical with the array of device structures, wherein each of the plurality of first trenches is intersected by the second trench; and filling the plurality of first trenches and the second trench with an insulating material, wherein the second trench divides the array of device structures into a first sub-array of device structures adjacent to the first staircase profile and a second sub-array of device structures adjacent to the second staircase profile in the first horizontal direction, and wherein (i) a first pair of the first sub-array of device structures and the first staircase profile and (ii) a second pair of the second sub-array of device structures and the second staircase profile are spaced from each other in the first horizontal direction by only the second trench filled with the insulating material.

16. The method of claim 15, wherein the first interface portion is electrically coupled to the first sub-array of device structures, and a second interface portion is electrically coupled to the second sub-array of device structures.

17. The method of claim 15, wherein each of a topmost layer and the bottommost layer of the stack comprises an insulating layer of the plurality of insulating layers.

18. The method of claim 15, wherein each of the device structures has a rectangular shape or a square shape in an X-Y plane.

19. The method of claim 18, wherein axial ends of each of the device structures are rounded.

20. The method of claim 18, wherein the device structures are memory devices.

* * * * *